(12) United States Patent
Ohta

(10) Patent No.: US 7,457,164 B2
(45) Date of Patent: Nov. 25, 2008

(54) SEMICONDUCTOR MEMORY DEVICE AND ELECTRONIC APPARATUS

(75) Inventor: Yoshiji Ohta, Kashiwara (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 147 days.

(21) Appl. No.: 11/541,719

(22) Filed: Oct. 3, 2006

(65) Prior Publication Data

US 2007/0086238 A1 Apr. 19, 2007

(30) Foreign Application Priority Data

Oct. 4, 2005 (JP) .............................. 2005-290992

(51) Int. Cl.
*G11C 11/34* (2006.01)

(52) U.S. Cl. .............................. 365/185.22; 365/185.2; 365/185.188

(58) Field of Classification Search ............ 365/185.22, 365/185.2, 185.18, 203, 230.03, 189.11, 365/210

See application file for complete search history.

(56) References Cited

U.S. PATENT DOCUMENTS 6,459,612 B2 * 10/2002 Satoh et al. ............ 365/185.03
6,912,160 B2   6/2005 Yamada
6,944,077 B2 * 9/2005 Morikawa ................ 365/204

FOREIGN PATENT DOCUMENTS

JP          2004-273093 A       9/2004

* cited by examiner

*Primary Examiner*—Dang T Nguyen
(74) *Attorney, Agent, or Firm*—Birch, Stewart, Kolasch & Birch, LLP

(57) ABSTRACT

In the semiconductor storage device, in a read operation, a bit line charging/discharging section 101 performs discharge of bit lines of a memory cell array 100, and a counter counts discharge periods over which the potentials of bit lines come to a specified potential, based on a comparison result of a comparator comparing a potential of a bit line with a reference potential. Based on the comparison result, a reference value generation section 104 generates a reference value (RCi) for determining information stored in each of the memory cells. The above count value (CBUSi) and the above reference value (RCi) are compared with each other by a data decision circuit 108. Based on the comparison result, an output data control circuit 109 outputs information stored in each of the memory cells. This semiconductor storage device suppresses increases in chip area and power consumption and outputs memory cell information accurately.

14 Claims, 20 Drawing Sheets

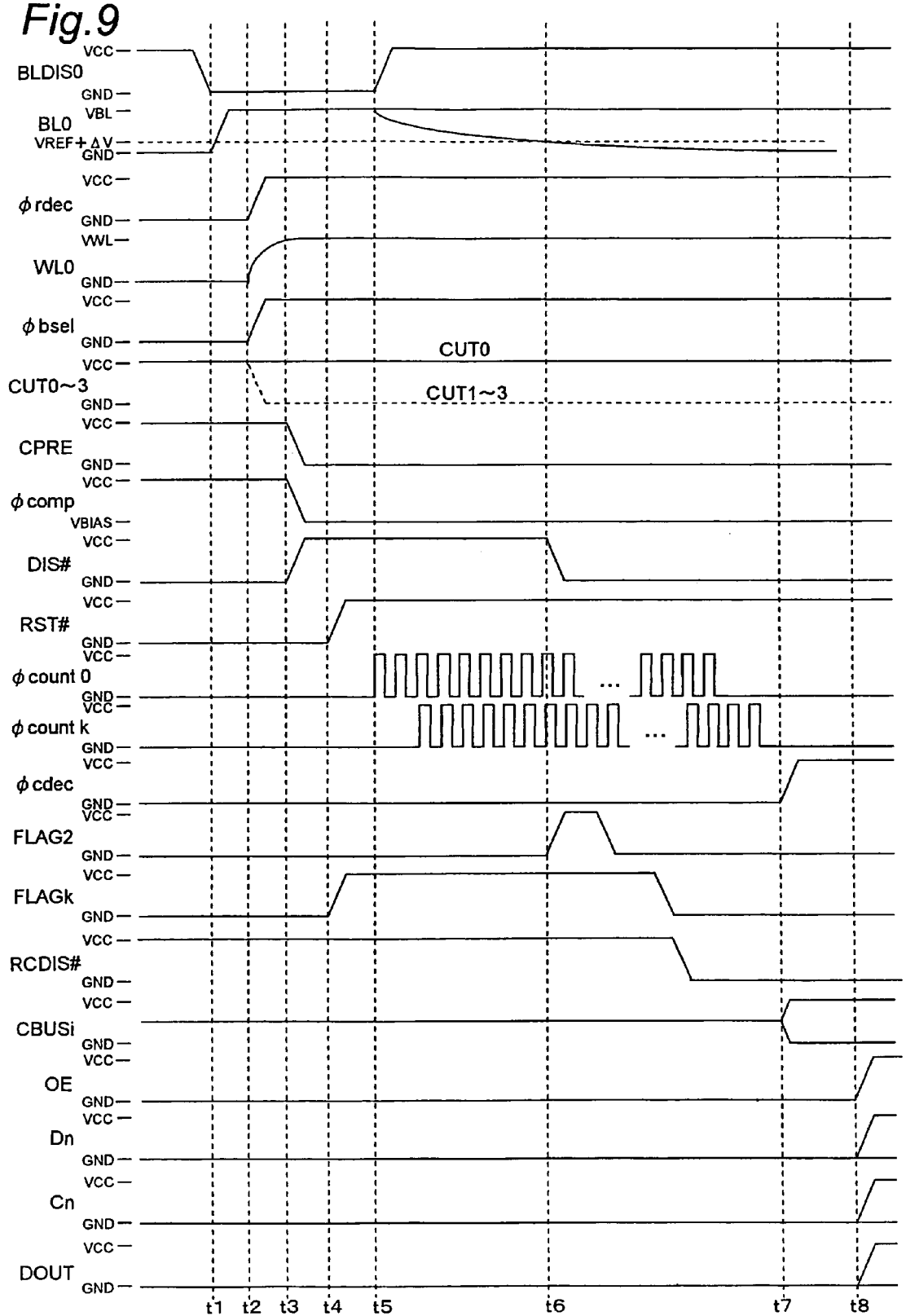

SEMICONDUCTOR MEMORY DEVICE AND ELECTRONIC APPARATUS

CROSS-REFERENCE TO RELATED APPLICATIONS

This nonprovisional application claims priority under 35 U.S.C. §119(a) on Patent Application No(s). 2005-290992 filed in Japan on Oct. 4, 2005, the entire contents of which are hereby incorporated by reference.

BACKGROUND OF THE INVENTION

The present invention relates to semiconductor storage devices and electronic equipment and, more particularly, to a semiconductor storage device, as well as electronic equipment using the device, which includes nonvolatile memory cells such as flash memory cells or mask ROM (read-only memory) cells.

Recently, nonvolatile memories such as flash memory, ferroelectric memory and mask ROM have been widely used as semiconductor storage devices for use of data storage or code storage in portable telephones and digital cameras. Also, capacity increases for increasing the storage capacity has been going on and on more than ever.

In these semiconductor storage devices, in which cell currents flowing through memory cells are changed to store data, even for memory cells having identical data stored therein, it is difficult to make their individual cell currents fully coincident with one another. Therefore, it is the usual case that even if a plurality of memory cells have stored identical information therein, values of the cell currents are distributed with some degree of width. However, since overlaps of cell current distributions among different data would incur a difficulty in correctly deciding data, verify operation is performed together with write operation or erase operation so that those respective distributions are not overlapped with one another. While, it is today's trend that gaps separating the distributions of cell currents from one another have been narrowing more and more along with advancing scale-down, voltage lowering, multi-valuing and the like.

Also, influences of disturb (external disturbance due to access to other memory cells) or endurance (deterioration of rewrite characteristic of memory cells due to increases in number of rewrite operations), retention (retaining characteristic of stored information against temperature changes, time variation, etc.) or the like differ from memory cell to memory cell. This causes a problem that even memory cells connecting to one word line differ in distribution state of cell current values from one another, giving rise to positional differences of gap regions that separate the distributions of cell currents according to different data from one another.

As a solution to these and other problems, there has conventionally been proposed a semiconductor storage device in which, with a plurality of special memory cells called reference cells provided for each word line, their current value or average current value is taken as a reference value and compared with a cell-current value of a memory cell to be read to decide data (see, e.g., JP 2004-273093 A). In this semiconductor storage device, two types of reference cells are connected to a word line, those reference cells being set to data 0 and data 1, respectively, and an average current value of the reference cells is used as the reference value. Further, taking into consideration that cell current values vary due to disturbs, distributions of cell current values of the individual memory cells are determined while the verify operation in writing is performed, and based on the determined distributions of cell current values, the cell current values of the reference cells are reset.

However, in this conventional semiconductor storage device, since a plurality of reference cells are provided for each word line, there is a problem that the chip area increases to a large extent. Further, in this conventional semiconductor storage device, since disturb is influential until the verify operation in writing is performed, there is a difficulty in making a decision as to how long intervals the verify operation should be done at. Moreover, this semiconductor storage device has a problem that extra time is required to re-set the cell current values of the reference cells.

SUMMARY OF THE INVENTION

The present invention having been accomplished in view of these and other problems, an object of the invention is to provide a semiconductor storage device and electronic equipment both of which, even if the reference value for cell currents used in deciding the information stored in the memory cells have varied among word lines or changed with time do not need to use reference cells and therefore are capable of correctly reading information stored in memory cells by detecting a reference value in each read operation without increasing the chip cell area.

In order to achieve the above object, there is provided a semiconductor storage device, comprising:

a memory cell array in which a plurality of nonvolatile memory cells are arrayed;

word lines connected to control input terminals of the plurality of memory cells;

bit lines connected to input/output terminals of the plurality of memory cells;

a word line select circuit for selecting the word lines;

a bit line charging/discharging section for performing charge and discharge of the bit lines;

a cell current-related value read circuit for, with respect to all or a specified number of memory cells out of the plurality of memory cells, performing discharge or charge of the bit lines by the bit line charging/discharging section to read cell current-related values related to cell currents flowing through the individual memory cells;

a reference value generation section for, based on a distribution of the cell current-related values read by the cell-current related value read circuit, generating a reference value to determine information stored in the memory cells;

a data decision circuit for comparing the values related to cell currents read by the cell-current related value read circuit and the reference value derived from the reference value generation section with each other, and an output section for, based on a result of the comparison by the data decision circuit, outputting information stored in each of the plurality of memory cells.

With the semiconductor storage device of this construction, in reading stored information of memory cells whose input/output terminals are connected to the selected bit lines and whose control input terminals are connected to word lines selected by the word line select circuit, discharge is performed for the selected bit lines by the bit line charging/discharging section from, for example, a charged state (otherwise, charge may be performed from a discharged state). In this discharge, since discharge is done via the memory cells selected by word lines and bit lines, there is shown a discharge characteristic that the potentials of the bit lines gradually decrease. After the discharge or charge of the bit lines is performed by the bit line charging/discharging section, values related cell currents flowing through individual memory cells are read by the cell-current related value read circuit with respect to all or a specified number of memory cells out of the plurality of memory cells. Based on a distribution of the values related to cell currents read out by the cell current related value read circuit, a reference value for determination of information stored in the memory cells is generated by the reference value generation section. The discharge period (or charge period) is generally inversely proportional to cell currents of memory cells selected by word lines and bit lines. By utilizing such a discharge characteristic (or charge characteristic) related cell currents of the memory cells, it becomes possible for the data decision circuit to make a decision as to the values related cell currents read by the cell-current related value read circuit and the reference value obtained by the reference value generation section. Based on a result of the decision, information stored in each of the plurality of memory cells is outputted from the output section. It is noted that the memory cells are not limited to those for storing therein binary-value information of "0" and "1," and may be those for storing multi-value information.

As shown above, the semiconductor storage device of the invention is a semiconductor storage device such as flash memory, ferroelectric memory or mask ROM, in which values related cell currents of memory cells, through which a constant current flows in their selected state, are read out by the cell-current related value read circuit, and the values related cell currents and the reference value obtained by the reference value generation section are compared with each other, by which data of the individual memory cells are read out. Accordingly, by determining stored information with the use of the values related to cell currents of memory cells and the reference value, information stored in the memory cells can be decided without using any conventional reference cell. Also, even if the distribution of cell current values is varied among word lines or changed with time, information stored in the memory cells can accurately be read out by virtue of the use of values related to cell currents that represent a characteristic that cell currents and discharge period (or charge period) are generally inversely proportional to each other. Further, since the reference value is obtained by the reference value generation section, the need for the conventional reference cell is eliminated. Moreover, since it is no longer necessary to reset the cell current value of the reference cell in response to changes of current values of memory cells due to disturb or the like, as would be involved in the prior art, circuitry and operation of the semiconductor storage device can be simplified to a large extent, so that the chip area can be cut down. Further, since the reference value generation section determines the reference value in parallel processing during the discharge (or charge) of bit lines, read operation can be carried out without loss of access time.

The semiconductor srorage device preferably comproses:

a memory cell array in which a plurality of nonvolatile memory cells are arrayed;

word lines connected to control input terminals of the plurality of memory cells;

bit lines connected to input/output terminals of the plurality of memory cells;

a word line select circuit for selecting the word lines;

a bit line charging/discharging section for performing charge and discharge of the bit lines;

a comparator to which the bit lines are connected and which compares potentials of the bit lines and the reference potential with each other;

a counter for, based on a result of the comparison by the comparator, counting count values representing discharge periods or charge periods over which the potentials of the bit lines come to a specified potential, in a read operation in which discharge or charge of the bit lines is performed by the bit line charging/discharging section;

a reference value generation section for, based on a result of the comparison by the comparator, generating a reference value to determine information stored in the memory cells;

a data decision circuit for comparing the count values derived from the counter and the reference value derived from the reference value generation section with each other; and an output section for, based on a result of the comparison by the data decision circuit, outputting information stored in each of the plurality of memory cells.

In the semiconductor, storage device as shown above, in reading stored information of memory cells whose input/output terminals are connected to the selected bit lines and whose control input terminals are connected to word lines selected by the word line select circuit, discharge is performed for the selected bit lines by the bit line charging/discharging section from, for example, a charged state (otherwise, charge may be performed from a discharged state). In this discharge, since discharge is done via the memory cells selected by word lines and bit lines, there is shown a discharge characteristic that the potentials of the bit lines gradually decrease. In this state, the potential of a bit line and the reference potential are compared with each other by the comparator, by which a change in the potential of the bit line with respect to the reference potential is detected. Based on a result of this comparison by the comparator, the counter counts the count value representing discharge period (or charge period) over which the potential of the bit line come to a specified potential. The count value representing the discharge period (or charge period) is generally inversely proportional to the cell current of a memory cell selected by word lines and bit lines. Also, based on the comparison result by the comparator, a reference value for determining information stored in each of the plurality of memory cells is generated by the reference value generation section. The count value corresponding to the discharge period (or charge period) obtained from the counter and the reference value obtained by the reference value generation section are compared with each other by the data decision circuit, and based on its comparison result, information stored in each of the plurality of memory cells are outputted from the output section. It is noted that the memory cells are not limited to those for storing therein binary-value information of "0" and "1," and may be those for storing multi-value information.

This semiconductor storage device is a semiconductor storage device such as flash memory, ferroelectric memory or mask ROM, in which discharge time (or charge time) lasting up to an inversion of the comparator that compares the potential of a bit line with the reference potential is counted by the counter according to cell currents of memory cells, through which a constant current flows in their selected state, and moreover a reference value for determining (converting the count value into a binary value) information written in the memory cells from a sum of timings of inversion of the comparators is detected, the resulting reference value being compared with the count value, by which data of the individual memory cells are read out. Accordingly, by using the count value that is generally inversely proportional to a cell current of the memory cell and the reference value for determining stored information, information stored in the memory cells can be decided without using the conventional reference cell. Also, even if the distribution of cell current values is varied among word lines or changed with time, information stored in the memory cells can accurately be read out by virtue of the use of count values corresponding to discharge period (or charge period) that are generally inversely proportional to cell currents. Further, since the reference value is obtained based on a comparison result by the comparator, the need for the conventional reference cell is eliminated. Moreover, since it is no longer necessary to reset the cell current value of the reference cell in response to changes of current values of memory cells due to disturb or the like, as would be involved in the prior art, circuitry and operation of the semiconductor storage device can be simplified to a large extent, so that the chip area can be cut down. Further, since the reference value generation section determines the reference value for determination of stored information based on the comparison result of the comparator in parallel processing during the discharge (or charge) of bit lines, read operation can be carried out without loss of access time.

In one embodiment of the invention, the cell-current related value read circuit has an A/D converter for converting potentials of the bit lines as the cell current-related values from analog to digital form in a read operation in which discharge or charge of the bit lines is performed by the bit line charging/discharging section.

With the semiconductor storage device of this embodiment, in reading stored information of memory cells whose input/output terminals are connected to the selected bit lines and whose control input terminals are connected to word lines selected by the word line select circuit, discharge is performed for the selected bit lines by the bit line charging/discharging section from, for example, a charged state (otherwise, charge may be performed from a discharged state). In this discharge, since discharge is done via the memory cells selected by word lines and bit lines, there is shown a discharge characteristic that the potentials of the bit lines gradually decrease. Accordingly, for example, down potential differences (or up potential differences) during a specified discharge period of bit lines are determined by the A/D converter, and based on a distribution of the potential differences, the values related to cell currents representing the discharge characteristic (or charge characteristic) of the bit lines can be obtained. Thus, the values related to cell currents representing the discharge characteristic (or charge characteristic) of the memory cells, through which a constant current flows in their selected state, are obtained by the A/D converter, and the obtained values related to cell currents and the reference value obtained by the reference value generation section are compared with each other, by which data of the individual memory cells are read out and their stored information can be determined. Also, even if the distribution of cell current values is varied among word lines or changed with time, information stored in the memory cells can accurately be read out by virtue of the use of the characteristic that cell currents and discharge period (or charge period) are generally inversely proportional to each other.

In one embodiment of the invention, the cell current related value read circuit has a comparator to which the bit lines are connected and which compares potentials of the bit lines and the reference potential with each other, and a counter for, based on a result of the comparison by the comparator, counting count values representing discharge periods or charge periods over which the potentials of the bit lines come to a specified potential, as cell current-related values, in a read operation in which discharge or charge of the bit lines is performed by the bit line charging/discharging section.

With the semiconductor storage device of this embodiment, in reading stored information of memory cells whose input/output terminals are connected to the selected bit lines and whose control input terminals are connected to word lines selected by the word line select circuit, discharge is performed for the selected bit lines by the bit line charging/discharging section from, for example, a charged state (otherwise, charge may be performed from a discharged state). In this discharge, since discharge is done via the memory cells selected by word lines and bit lines, there is shown a discharge characteristic that the potentials of the bit lines gradually decrease. In this state, a change in the potential of the bit line is detected by the comparator. Based on this comparison result by the comparator, the counter counts the count value representing a discharge period (or charge period) of the bit line as the value related to the cell current. Thus, discharge time (or charge time) lasting up to an inversion of the comparator due to a potential change of the bit line is counted by the counter according to cell currents of memory cells, through which a constant current flows in their selected state, and moreover the count value of each counter and the reference value obtained by the reference value generation section are compared with each other, by which data of the individual memory cells can be read out and their stored information can be determined. Also, even if the distribution of cell current values is varied among word lines or changed with time changes, information stored in the memory cells can accurately be read out by virtue of the use of count values corresponding to the discharge period (or charge period) that is generally inversely proportional to cell currents.

In one embodiment of the invention, the comparator is provided in a plurality, and the reference value generation section has a data transition detection circuit to which outputs of the plurality of comparators are connected, a reference value detection circuit to which an output of the data transition detection circuit is connected, and a reference value counter to which an output of the reference value detection circuit is connected.

In the semiconductor storage device of this embodiment, transitions of outputs from the comparators are detected by the data transition detection circuit, and outputs of the reference value detection circuit to which the output of the data transition detection circuit is connected are counted by the reference value counter. The transitions of outputs from the comparators show timings of start and end of a discharge period (or charge period) of a potential of a bit line. The counting of the reference value counter is started at a start of discharge, and the counting by the reference value counter is halted at a timing at which the output signal from the comparator has transited, by which it becomes possible to count the count value corresponding to the discharge period (or charge period). Accordingly, for example, with respect to a plurality of memory cells selected by word lines, a count value corresponding to the discharge period (or charge period) of a potential of a bit line can be obtained based on transitions of output signals derived from a plurality of comparators with a simple construction. By the reference value generation section of such a circuit construction, it also becomes possible to generate the reference value simultaneously in parallel with the counting by the counter during the discharge (or charge) of bit lines.

Desirably, in the semiconductor storage device, the comparators are provided for every one bit line or for every some plurality of bit lines, output signals derived from the plurality of comparators transit when a potential of the bit line becomes smaller than the reference potential during discharge or when the potential of the bit line becomes larger than the reference potential during charge, the reference value generation section has a data transition detection circuit for detecting transitions of the output signals derived from the plurality of comparators, and a reference value counter counts the reference value for determination of information stored in each of the plurality of memory cells based on signals representing transitions of the output signals derived from the plurality of comparators detected by the data transition detection circuit.

In such a semiconductor storage device, transitions of output signals derived from the comparators are detected by the data transition detection circuit, and based on a signal representing the transitions of the output signals, the reference value for determining information stored in each of the plurality of memory cells is counted by the reference value counter. A transition of an output signal derived from the comparator shows a timing at which the potential of a bit line becomes smaller (or larger) than the reference potential due to discharge (or charge). Therefore, the counting by the reference value counter is started at a start of discharge, and the counting by the reference value counter is halted at a timing at which the output signal from the comparator has transited, by which the count value corresponding to a discharge period (or charge period) can be counted. Accordingly, for example, with respect to a plurality of memory cells selected by word lines, a reference value for determining stored information of the plurality of memory cells selected by the word lines can be obtained based on transitions of output signals derived from the plurality of comparators, with a simple construction. Also, by the reference value generation section of such a circuit construction, it also becomes possible to generate the reference value simultaneously in parallel with the counting by the counter during the discharge (or charge) of bit lines.

In one embodiment of the invention, the comparator is provided in a plurality, and the data transition detection circuit has a plurality of pulse signal generation circuits responsive to transitions of outputs of the plurality of comparators, and an OR signal generation circuit for generating an OR signal of outputs of the plurality of pulse signal generation circuits.

In the semiconductor storage device of this embodiment, pulse signals corresponding to transitions of outputs derived from the plurality of comparators are generated by the plurality of pulse signal generation circuits, respectively, and outputs of the plurality of pulse signal generation circuits are ORed by the OR signal generation circuit, by which an OR signal is obtained. As a result of this, signals representing aggregatory transition points (points each showing an end of a discharge period (or charge period)) of output signals derived from the plurality of comparators can be detected with a simple construction.

Desirably, in the semiconductor storage device, the data transition detection circuit has a plurality of pulse signal generation circuits for generating pulse signals, respectively, representing transitions of the output signals derived from the plurality of comparators, and an OR signal generation circuit for generating an OR signal by ORing pulse signals derived from the plurality of pulse signal generation circuits.

In such a semiconductor storage device, pulse signals corresponding to transitions of output signals derived from the plurality of comparators are generated by the plurality of pulse signal generation circuits, respectively, and the plurality of pulse signals are ORed by the OR signal generation circuit, by which an OR signal is obtained. As a result of this, signals representing aggregatory transition points (points each showing an end of a discharge period (or charge period)) of output signals derived from the plurality of comparators can be detected with a simple construction.

In one embodiment of the invention, the counter is provided in a plurality, and a time difference is imparted to clock signals inputted to the plurality of counters, respectively.

In the semiconductor storage device of this embodiment, since a time difference is imparted to clock signals that are inputted to the plurality of counters, respectively, wiring delay and logic circuit delay are artificially created so that the count operation of the counter is also delayed in accordance therewith. Thus, the count value corresponding to an actual discharge period (or charge period) can accurately be counted.

Desirably, in the semiconductor storage device, the counters are provided for every one bit line or for every some plurality of bit lines, and the semiconductor storage device further comprises a clock signal delay circuit for delaying clock signals inputted to the plurality of counters, respectively, one after another.

In such a semiconductor storage device, clock signals inputted to the plurality of counters, respectively, are delayed one after another by the clock signal delay circuit, by which wiring delay and logic circuit delay are artificially created so that count operations by the counters are also delayed in accordance therewith. Thus, the count value corresponding to the actual discharge period (or charge period) can accurately be counted.

In one embodiment of the invention, the bit line charging/discharging section has a plurality of bit line charging/discharging circuits, and a time difference is imparted to discharge or charge timing signals inputted to the individual bit line charging/discharging circuits.

In the semiconductor storage device of this embodiment, since a time difference is imparted to timing signals which are inputted to the plurality of bit line charging/discharging circuit, respectively, and which serve for performing discharge or charge, wiring delay and logic circuit delay are artificially created so that the timing of discharge (or charge) is also delayed. By doing so, even if a large number of memory cells are connected to one word line and if wiring delay or logic circuit delay in the reference value generation section is involved, simultaneity of charge and discharge operations can be maintained among all the memory cells connected to one word line, so that an accurate reference value can be obtained.

Desirably, in the semiconductor storage device, the bit line charging/discharging section includes:

a plurality of bit line charging/discharging circuits provided for every one bit line or for every some plurality of bit lines; and a charging/discharging control signal delay circuit for delaying charging/discharging control signals inputted to the plurality of bit line charging/discharging sections, respectively, one after another.

In such a semiconductor storage device, charging/discharging control signals which are inputted to the plurality of bit line charging/discharging circuits, respectively, provided for every one bit line or for every some plurality of bit lines and which serve for performing discharge or charge are delayed one after another by the charging/discharging control signal delay circuit, by which wiring delay and logic circuit delay are artificially created so that the timing of discharge (or charge) is also delayed. By doing so, even if a large number of memory cells are connected to one word line and if wiring delay or logic circuit delay in the reference value generation section is involved, simultaneity of charge and discharge operations can be maintained among all the memory cells connected to one word line, so that an accurate reference value can be obtained.

In one embodiment of the invention, the semiconductor storage device further comprising:

an upper-limit value register for holding an upper-limit value; and a reference value determination circuit for comparing the upper-limit value of the upper-limit value register with an output of the reference value generation section.

In the semiconductor storage device of this embodiment, an upper-limit value stored in the upper-limit value register and an output of the reference value generation section are compared with each other by the reference value determination circuit. As an example, it is assumed that the upper-limit value is a value showing a boundary of distributions of information stored in a plurality of memory cells. In the case of a memory cell that stores binary-value information of "1" with a smaller cell current and "0" with a larger cell current, when the reference value of the reference value generation section is larger than the upper-limit value, it can be decided that information stored in all the memory cells is "1," regardless of a comparison result of the data decision circuit. Accordingly, if the reference value is larger than the upper-limit value, "1" is outputted, while if the reference value is equal to or smaller than the upper-limit value, the output section outputs information stored in each of the plurality of memory cells based on a comparison result by the data decision circuit. Thus, the state of distribution of stored information is decided by using an upper-limit value showing a boundary of distributions of information stored in the plurality of memory cells. Therefore, even if stored information of memory cells to be read out at a time is "0" in all or "1" in all, it is possible to make a decision of that so that data can be read accurately.

Desirably, the semiconductor storage device further comprises:

an upper-limit value register for retaining an upper-limit value showing a boundary of distributions of count value of the counter in a read of information stored in the plurality of memory cells; and a reference value determination circuit for comparing the upper-limit value stored in the upper-limit value register and the reference value generated by the reference value generation section with each other, wherein based on a comparison result by the data decision circuit and a comparison result by the reference value determination circuit, the output section outputs information stored in each of the plurality of memory cells.

In such a semiconductor storage device, an upper-limit value showing a boundary of distributions of information stored in the plurality of memory cells is retained in the upper-limit value register, and the upper-limit value and the reference value of the reference value generation section are compared with each other by the reference value determination circuit. For example, in the case of a memory cell that stores binary-value information of "1" with a smaller cell current and "0" with a larger cell current, when the reference value of the reference value generation section is larger than the upper-limit value, it can be decided that information stored in all the memory cells is "1," regardless of a comparison result of the data decision circuit. Accordingly, if the reference value is larger than the upper-limit value, "1" is outputted, while if the reference value is equal to or smaller than the upper-limit value, the output section outputs information stored in each of the plurality of memory cells based on a comparison result by the data decision circuit. Thus, the state of distribution of stored information is decided by using an upper-limit value showing a boundary of distributions of information stored in the plurality of memory cells. Therefore, even if stored information of memory cells to be read out at a time is "0" in all or "1" in all, it is possible to make a decision of that so that data can be read accurately.

In one embodiment of the invention, a write end decision value for write operation is used as the upper-limit value.

In the semiconductor storage device of this embodiment, since a write end decision value in write operation is used as the upper-limit value, an optimum upper-limit value that is not affected by secular changes can be obtained without providing any additional circuits.

In one embodiment of the invention, the semiconductor storage device further comprises:

a write end decision circuit for comparing a write-use count value and a count value of the counter obtained from a read for verify in write operation with each other to decide whether or not a write operation has been ended; and a write voltage control circuit for controlling voltages applied to the bit lines based on a decision result by the write end decision circuit.

In the semiconductor storage device of this embodiment, by making a comparison between a write-use count value and a count value of the counter obtained by a read for verify in write operation, whether or not a write operation has been ended is decided by the write end decision circuit. Based on a result of the decision, the voltage applied to the bit lines is controlled by the write voltage control circuit. As a result of this, count values among stored information pieces of individual memory cells after an end of a write operation can be uniformized so that the distribution width of cell current values can be narrowed.

In one embodiment of the invention, the semiconductor storage device as claimed in claim 3, further comprises:

an erase end decision circuit for comparing an erase-use count value and a value of the counter obtained from a read for verify in erase operation with each other to decide whether or not an erase operation has been ended; and an erase voltage control circuit for controlling voltages applied to the bit lines based on a decision result by the erase end decision circuit.

In the semiconductor storage device of this embodiment, by making a comparison between an erase-use count value and a count value of the counter in verify operation after an erase, whether or not an erase operation has been ended is decided by the erase end decision circuit, and based on a result of the decision, the voltage applied to bit lines is controlled by the erase voltage control circuit. As a result of this, count values among individual memory cells after an end of an erase operation can be uniformized so that the distribution width of cell current values can be narrowed.

In one embodiment of the invention, the semiconductor storage device further comprises a bit line potential output circuit for selecting from among the bit lines and outputting potentials of the selected bit lines to outside.

In the semiconductor storage device of this embodiment, by making it possible to output potentials of bit lines selected by the bit-line potential output circuit to outside, it becomes possible to directly measure cell currents of individual memory cells with a peripheral circuit or a measuring instrument outside the chip. Thus, it becomes possible to do debug or correction of circuits as well as measurement of detailed memory cell characteristics and the like.

In one embodiment of the invention, the nonvolatile memory cells are implemented by using a side wall memory having a source region, a drain region, a channel region formed between the source region and the drain region, a gate formed on the channel region, and charge retention regions formed on both sides of the gate.

In the semiconductor storage device of this embodiment, even in use of a side wall memory in which cell current values are more highly influenced by stored information of neighboring charge retention regions (e.g., nitride) selected by an identical word line, stored information of desired charge retention regions can accurately be read out.

In one embodiment of the invention, there is provided an electronic equipment in which the above semiconductor storage device is used.

In the electronic equipment of this embodiment, in the case where the semiconductor storage device is used for electronic equipment such as portable information equipment (portable telephones etc.), digital cameras, digital recorders and the like, since neither reference cell nor a circuit for adjusting the cell current value of the reference cell is used, increases in chip area and power consumption can be suppressed. Also, memory cell information can accurately be read out even if the distributions of cell currents are varied among word lines or changed with time. Thus, there can be provided electronic equipment having high reliability.

As apparent from the above description, with the semiconductor storage device of the invention, there is no need for using a reference cell and therefore there can be fulfilled a semiconductor storage device capable of correctly reading information stored in memory cells without increasing the chip cell area.

Also, with the electronic equipment of the invention, there can be fulfilled electronic equipment of low cost and high reliability by using the semiconductor storage device.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 9 is a timing chart of read operation in the semiconductor storage device;

DETAILED DESCRIPTION OF THE INVENTION

Hereinbelow, a semiconductor storage device and electronic equipment of the present invention will be described in detail by embodiments thereof illustrated in the accompanying drawings.

Figure 1:
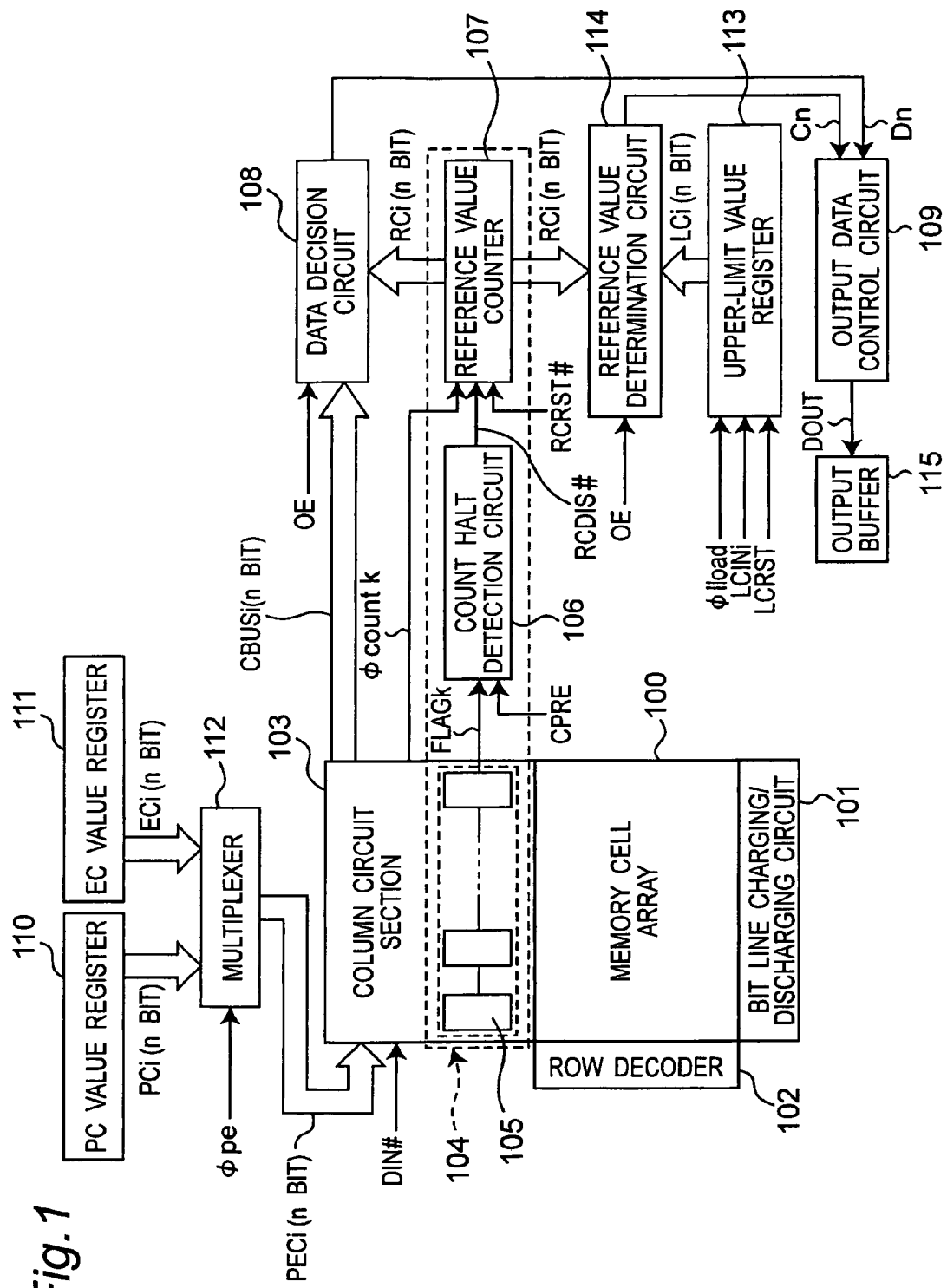
FIG. 1 is a block diagram showing main part of a semiconductor storage device according to an embodiment of the present invention.

FIG. 1 shows a block diagram of the whole semiconductor storage device of the embodiment of the invention.

This semiconductor storage device, as shown in FIG. 1, includes a memory cell array 100 in which a plurality of nonvolatile memory cells (shown in FIG. 2) are arrayed, a row decoder 102 which is an example of a word line select circuit for selecting bit lines (shown in FIG. 2) connected to input/output terminals of a plurality of memory cells of the memory cell array 100, a bit line charging/discharging section 101 for performing charge and discharge for the bit lines, and a column circuit section 103 having a comparator (shown in FIG. 2) for comparing potentials of the bit lines with a reference potential, a counter (shown in FIG. 2) for counting, based on an output signal from the comparator, a count value corresponding to a discharge period over which the bit line potential becomes the reference potential, and the like. Input data DIN# is inputted to a terminal of the column circuit section 103. Also, the column circuit section 103 has a plurality of data transition detection circuits 105.

The semiconductor storage device also includes a count halt detection circuit 106 (its circuit diagram shown in FIG.

7A) for detecting a timing of count halt based on an OR signal FLAGk outputted from the final stage of the data transition detection circuits and a reset signal CPRE 105, and a reference value counter 107 (its circuit diagram shown in FIGS. 7B and 7C) for, upon reception of a signal RCDIS# outputted from the count halt detection circuit 106 as well as a signal φcountk and a reset signal RCRST, counting the reference value to specifically determine storage information of memory cells. The data transition detection circuits 105, the count halt detection circuit 106 as an example of the reference value detection circuit, and the reference value counter 107 constitute a reference value generation section 104.

Further, the semiconductor storage device includes a data decision circuit 108 (its circuit diagram shown in FIG. 7D) for comparing a count value RCi of the reference value counter 107 and a count value (read via a bus line for a signal CBUSi) of the counters (shown in FIG. 2) in the column circuit section 103 with each other to decide data (stored information) stored in memory cells according to a signal OE, an upper-limit value register 113 (its circuit diagram shown in FIG. 8A) for, upon reception of a signal φlload, a signal LCINi and a reset signal LCRST, holding an upper-limit value showing a boundary of distributions of data of memory cells, and a reference value determination circuit 114 (its circuit diagram shown in FIG. 8B) for comparing an upper-limit value LCi of the upper-limit value register 113 and a count value RCi of the reference value counter 107 with each other to decide a distribution state of data according to the signal OE.

Further, the semiconductor storage device includes an output data control circuit 109 (its circuit diagram shown in FIG. 8C) for generating output data based on an output signal Dn from the data decision circuit 108 and an output signal Cn from the reference value determination circuit 114, and an output buffer 115 for, upon reception of an output signal DOUT of the output data control circuit 109, outputting data to outside. The output data control circuit 109 and the output buffer 115 constitute an output section.

Further, the semiconductor storage device includes a PC value register 110 for holding a write end decision value PCi, an EC value register 111 for holding an erase end decision value ECi, and a multiplexer 112 for selecting either one of the write end decision value held in the PC value register 110 and the erase end decision value held in the EC value register 111 on the basis of a signal φpe to output an end decision value PECi to the column circuit section 103.

Figure 2:
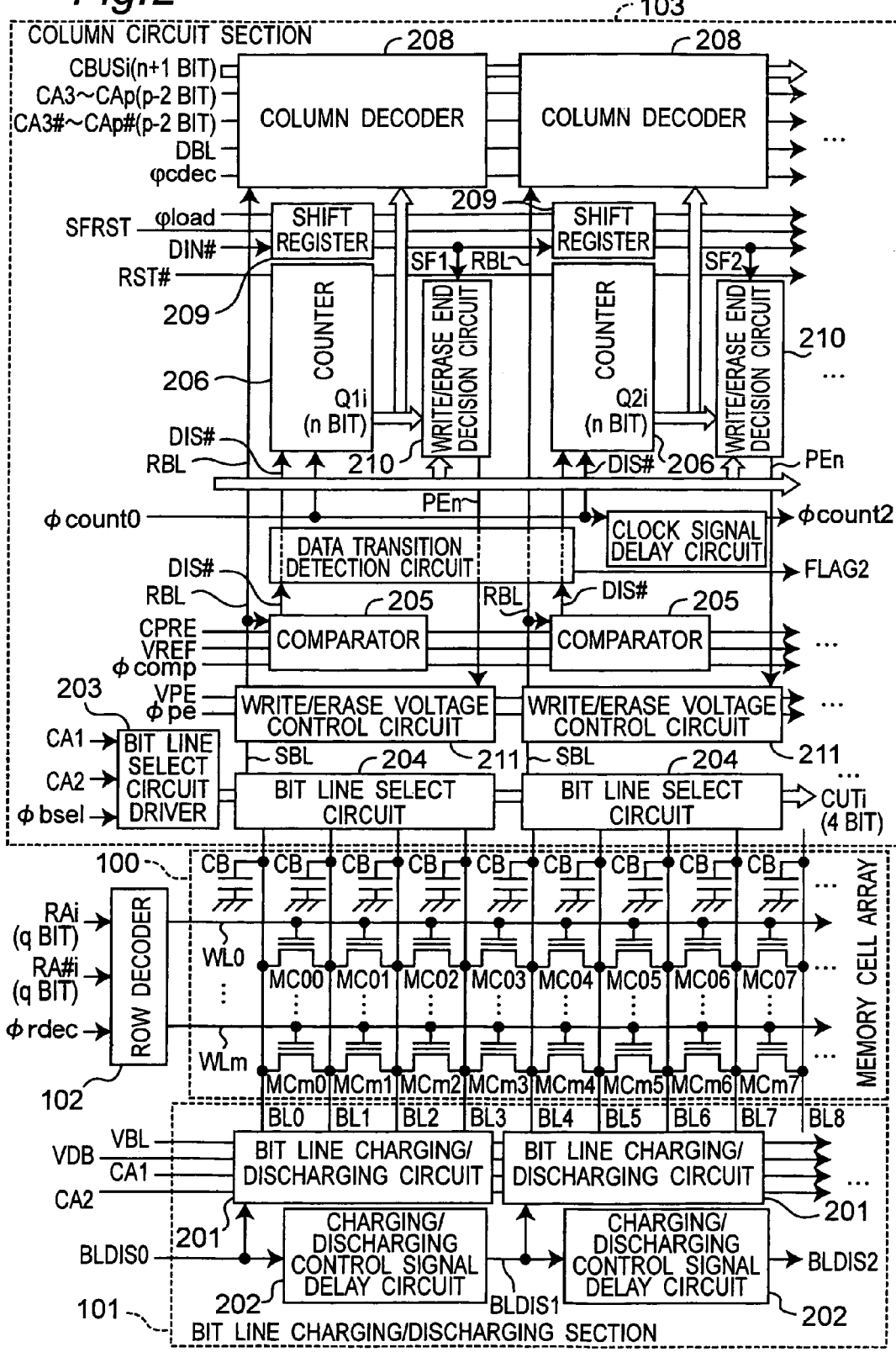
FIG. 2 is a detailed block diagram showing a core section of the semiconductor storage device.

FIG. 2 shows a detailed block diagram of the core section of the semiconductor storage device.

As seen from FIG. 2, the memory cell array 100 of the core section of the semiconductor storage device has a plurality of nonvolatile memory cells MC00, MC01, . . . , MCm0, MCm1, . . . arrayed in a matrix shape. The bit line charging/discharging section 101 (its circuit diagram shown in FIG. 3A) has a bit line charging/discharging circuit 201 (its circuit diagram shown in FIG. 3A) and a charging/discharging control signal delay circuit 202 (its circuit diagram shown in FIG. 3B). The bit line charging/discharging circuit 201, upon receiving a charge voltage VBL, a voltage VDB and signals CA1, CA2, performs charge and discharge of bit lines based on a charging/discharging control signal BLDISj (j=0, 1, . . . , k) as an example of a timing signal. Word lines WL0-WLm connected to control input terminals of the memory cells MC00, MC01, . . . , MCm0, MCm1, . . . are selected based on signals RAi, RAi# and a signal φrdec by the row decoder 102. The column circuit section 103 decides, and output, data read from the memory cell array 100. It is noted that CB in FIG. 2 denotes a bit line parasitic capacitance.

The column circuit section 103 includes: a bit line select circuit driver 203 (its circuit diagram shown in FIG. 3C) for generating a bit line select signal CUTi (composed of 4 bits, CUT0-CUT3, in this case) based on signals CA1, CA2 and a signal φbsel; a bit line select circuit 204 (its circuit diagram shown in FIG. 4A) for selecting bit lines BL0, BL1, . . . by the bit line select signal CUTi; a comparator 205 (its circuit diagram shown in FIG. 4B) for comparing a voltage of a selected bit line with a reference voltage VREF based on the signal CPRE and a signal φcomp; data transition detection circuits 105 (their circuit diagram shown in FIG. 4C) for generating a pulse signal PULSEj (see FIG. 4C) of a constant width by a signal DIS# of the comparator 205 and then ORing and transferring an OR signal FLAGj (j=2, 4, . . . , k) to its succeeding stage; an n-bit counter 206 (its circuit diagram shown in FIG. 5A, 5B) for halting count operation based on a clock signal φcountj (j=0, 2, . . . , k) and the signal RST# similarly by the signals DIS#; a clock signal delay circuit 207 (its circuit diagram shown in FIG. 5C) for delaying, at a constant rate, a clock signal φcountj (j=0, 2, . . . , k (even numbers only)) where k is a number of memory cells to be read at once) inputted to the n-bit counter 206; a column decoder 208 (its circuit diagram shown in FIG. 5D) for outputting, based on signals CA3-CAp, CA3#-CAp# and a signal φcdec, output results of the counter 206 to the bus line (with n-bit width) of the signal CBUSi; a shift register 209 (its circuit diagram shown in FIG. 6A) for, based on input data DIN# and a signal φload as well as a signal SFRST, reading and holding write data in write operation; a write/erase end decision circuit 210 (its circuit diagram shown in FIG. 6B) which is an example of a write end decision circuit for deciding an end of write operation and an erase end decision circuit for deciding an end of erase operation from an output signal Qji of the counter 206 and an output signal SFi (i=1, 2, . . . , k) of the shift register 209 as well as inputted end decision values PECi; and a write/erase voltage control circuit 211 (its circuit diagram shown in FIG. 6C) which is an example of a write voltage control circuit and an erase voltage control circuit for changing voltage values to be fed to the bit lines BL0, BL1, . . . upon reception of a signal PEn representing a result of the write/erase end decision circuit 210. The end decision values PECi is a PC value (write count value) or an EC value (erase count value) The column decoder 208, upon receiving a signal DBL, connects the bit line RBL to outside. The column decoder 208 has a function as a bit-line potential output circuit for selecting a bit line and outputting the potential of the selected bit line to outside. The comparator 205 and the counter 206 constitute a cell current-related value read circuit, in which the count values as an example of the values related to cell currents flowing through memory cells are counted by the counter 206.

The end decision values PECi to be used in the write/erase end decision circuit 210 is inputted from either one of the PC value register 110 and the EC value register 111 to the column circuit section 103 via the multiplexer 112.

In this case, the bit lines are provided in a virtual ground method, particularly in a memory cell array in which every one of four bit lines can be read out, where the bit line select circuit 204 is used for the selection of the bit lines. However, the bit lines may be in a fixed ground system, and the bit line select circuit is not limitative, for the present invention, in terms of its presence or absence, its type and the like.

Next, according to FIGS. 3A and 8C, a concrete example of the circuits in main part of the semiconductor storage device shown in FIGS. 1 and 2 are described below.

Figure 3A:
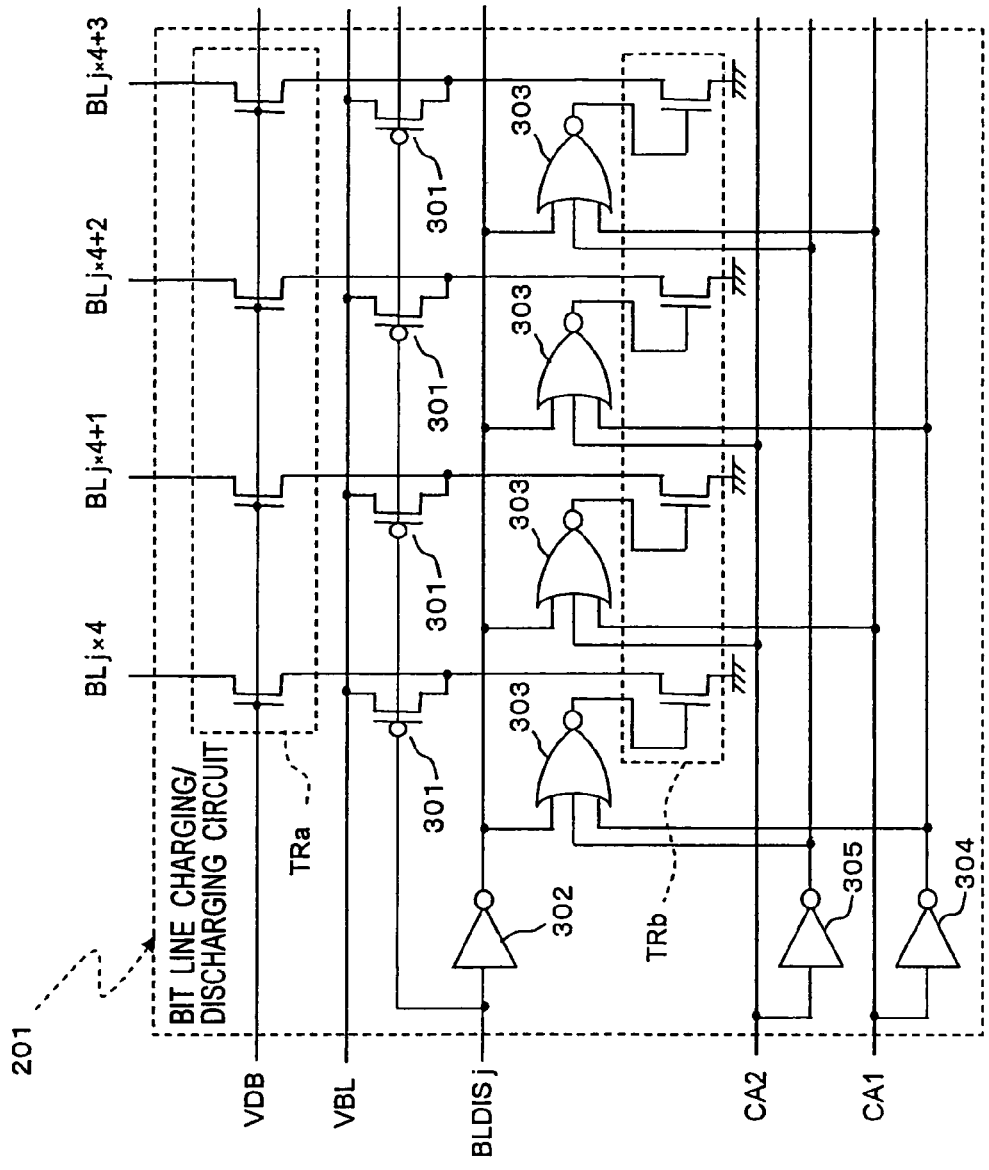
FIG. 3A is a circuit diagram of a bit line charging/discharging circuit shown in FIG. 2.

FIG. 3A shows a circuit diagram of the or each bit line charging/discharging circuit 201 shown in FIG. 2, where the bit line charging/discharging circuits 201 is provided by k in number (where k is an even number) in this semiconductor storage device.

As shown in FIG. 3A, the voltage VDB is applied to each of the bases of four NMOS transistors of a transistor block TRa, and bit lines BLjx4–BLjx4+3 (j=1, 2, . . . , k) are connected to their drains in order one after another. In the transistor block TRa, the connection between the bit lines BLjx4–BLjx4+3 and the bit line charging/discharging section is turned on and off based on the voltage VDB. Also, a charging/discharging control signal BLDISj are inputted to the gates of four PMOS transistors 301, respectively, the charge voltage VBL is applied to their sources, and the drains of the four PMOS transistors 301 are connected to the sources of their corresponding four NMOS transistors of the transistor block TRa, respectively. Also, the charging/discharging control signal BLDISj is inputted to the input terminal of an inverter 302. An output terminal of the inverter 302 is connected to each of first input terminals of four NOR (NOT-OR) gates 303. Signals CA1, CA2 derived from an unshown control circuit are connected to input terminals of inverters 304, 305, respectively. Further, output terminals of the inverters 304, 305 are connected to second and third input terminals, respectively, of the NOR gate 303 corresponding to the bit line BLjx4, and moreover the signals CA1, CA2 are inputted to second and third input terminals of the NOR gate 303 corresponding to the bit line BLjx4+1, respectively. Also, an output terminal of the inverter 304 is connected to the second input terminal of the NOR gate 303 corresponding to the bit line BLjx4+2, and the signal. CA2 is inputted to its third input terminal. The signal CA1 is inputted to the second input terminal of the NOR gate 303 corresponding to the bit line BLjx4+3, and the output terminal of the inverter 305 to its third input terminal. The output terminals of the NOR gates 303 are connected to the gates of the four NMOS transistors of a transistor block TRb, respectively. The drains of the four NMOS transistors of the transistor block TRb are connected to the drains of their corresponding PMOS transistors 301, respectively, and the sources are connected to the ground. In the transistor block TRb, the connection of the bit lines BLjx4–BLjx4+3 to the ground is turned on and off to control discharge of the bit lines BLjx4–BLjx4+3.

Figure 3B:
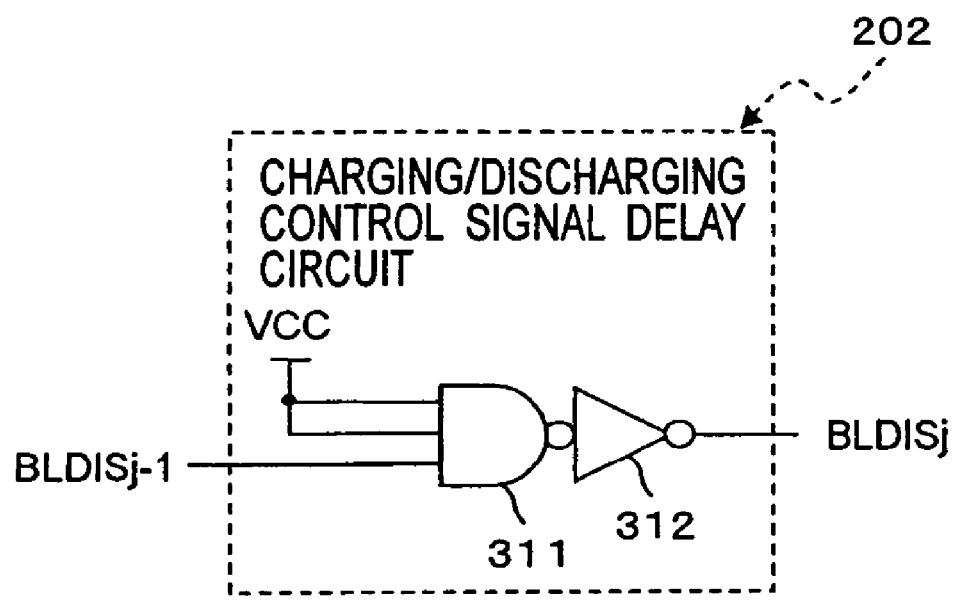
FIG. 3B is a circuit diagram of a charging/discharging control signal delay circuit shown in FIG. 2.

FIG. 3B shows a circuit diagram of the or each charging/discharging control signal delay circuit 202 shown in FIG. 2, where the charging/discharging control signal delay circuit 202 is provided by k in number like the bit line charging/discharging circuit 201.

As shown in FIG. 3B, a power supply voltage VCC is applied to first and second input terminals of a three-input NAND (NOT-AND) gate 311, and a charging/discharging control signal BLDISj (j=1, 2, . . . , k) is inputted to its third input terminal. The input terminal of an inverter 312 is connected to the output terminal of the NAND gate 311. A charging/discharging control signal BLDISj+1 is outputted from the output terminal of the inverter 312. By these k charging/discharging control signal delay circuits 202, the charging/discharging control signals BLDIS1-BLDISk are delayed from the charging/discharging control signal BLDIS0 one after another.

Figure 3C:
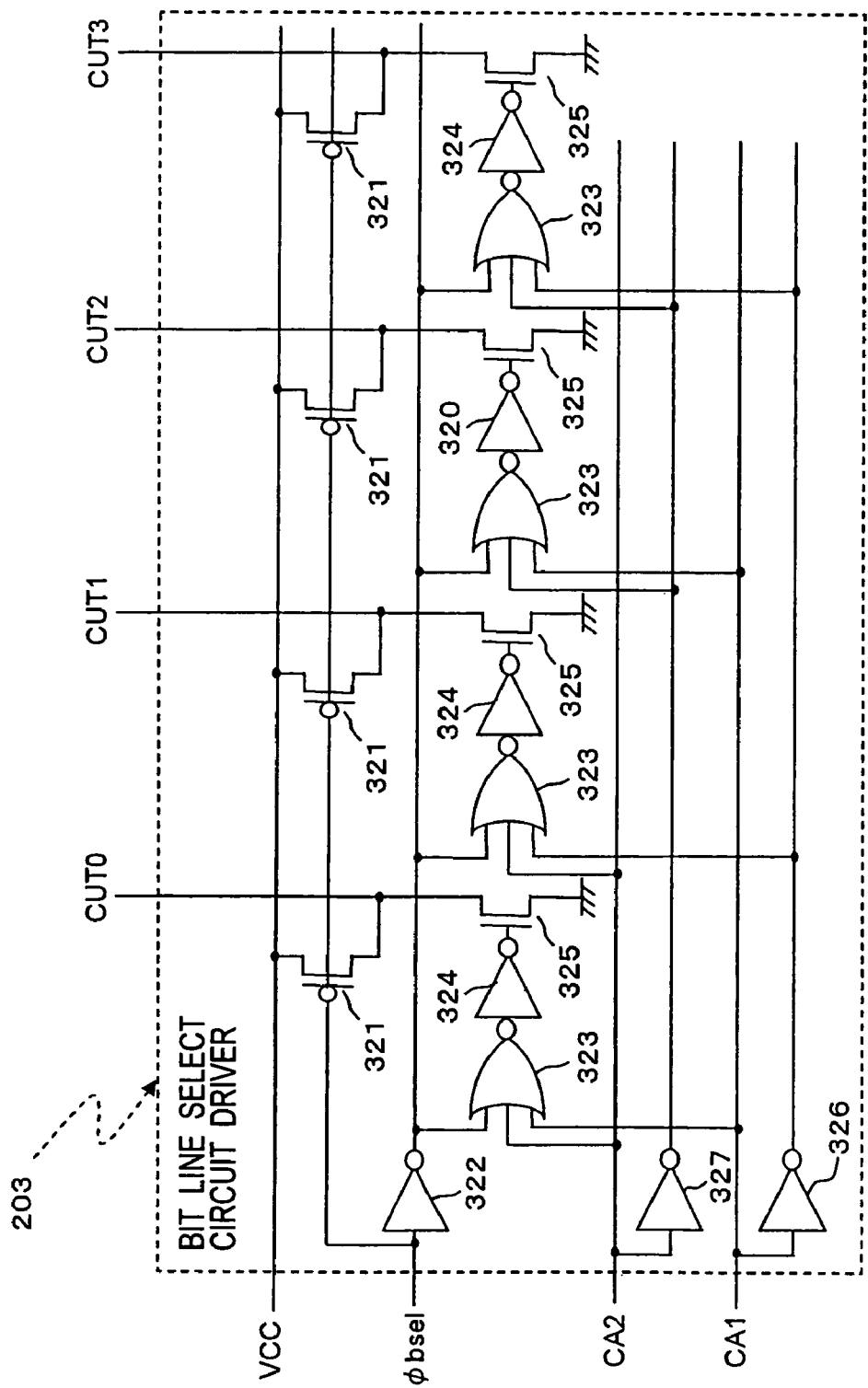
FIG. 3C is a circuit diagram of a bit line select circuit driver shown in FIG. 2.

FIG. 3C shows a circuit diagram of the or each bit line select circuit driver 203 shown in FIG. 2. As shown in FIG. 3C, the signal φbsel is inputted to each of the gates of the four PMOS transistors 321, and the power supply voltage VCC is applied to their sources. Also, the signal φbsel is inputted to the input terminal of an inverter 322. An output terminal of the inverter 322 is connected to each of first input terminals of the four NOR gates 323. Output terminals of the NOR gates 323 are connected to input terminals of four inverters 324, respectively, and output terminals of the inverters 324 are connected to four NMOS transistors 325, respectively. The drains of the four NMOS transistors 325 are connected to the drains of their corresponding PMOS transistors 321, respectively, while the sources of the four NMOS transistors 325 are connected to the ground. The NMOS transistors 325 output, from their drains, bit line select signals CUT0-CUT3 in order from the left to right side in FIG. 3C. Also, the signals CA1, CA2 derived from an unshown control circuit are connected to input terminals of inverters 326, 327, respectively. Further, the signals CA1, CA2 are inputted to second and third input terminals, respectively, of the NOR gate 323 corresponding to the bit line select signal CUT0. Also, an output terminal of the inverter 326 is connected to the second input terminal of the NOR gate 323 corresponding to the bit line select signal CUT1, and the signal CA2 is inputted to its third input terminal. The signal CA1 is further inputted to the second input terminal of the NOR gate 323 corresponding to the bit line select signal CUT2, and an output terminal of the inverter 327 is connected to its third input terminal. The output terminal of the inverter 326 is connected to the second input terminal of the NOR gate 323 corresponding to the bit line select signal CUT3, and the output terminal of the inverter 327 is connected to its third input terminal.

Figure 4A:
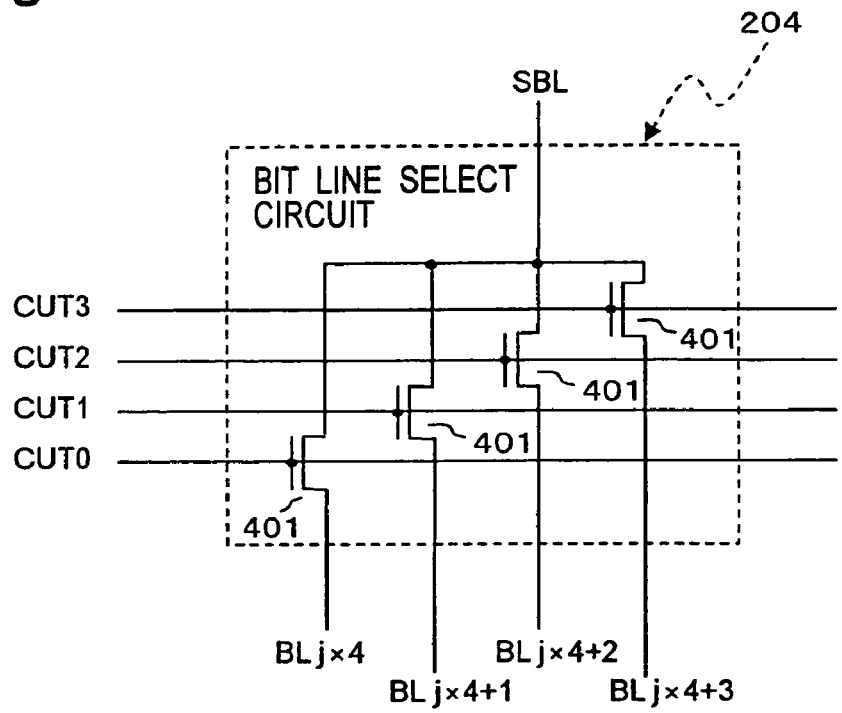
FIG. 4A is a circuit diagram of a bit line select circuit shown in FIG. 2.

FIG. 4A shows a circuit diagram of the or each bit line select circuit 204 shown in FIG. 2, where the bit line select circuit 204 is provided by k in number (where k is an even number) like the bit line charging/discharging circuit 201.

As shown in FIG. 4A, the bit line select signal CUT0 is connected to the gate of a first NMOS transistor 401, and the bit line BLjx4 is connected to the source of the first NMOS transistor 401. Also, the bit line select signal CUT1 is connected to the gate of a second NMOS transistor 401, and the bit line BLjx4+1 is connected to the source of the second NMOS transistor 401. The bit line select signal CUT2 is connected to the gate of a third NMOS transistor 401, and the bit line BLjx4+2 is connected to the source of the third NMOS transistor 401. Further, the bit line select signal CUT3 is connected to the gate of a fourth NMOS transistor 401, and the bit line BLjx4+3 is connected to the source of the fourth NMOS transistor 401. A select bit line SBL is connected to each of the drains of the NMOS transistors 401.

Figure 4B:
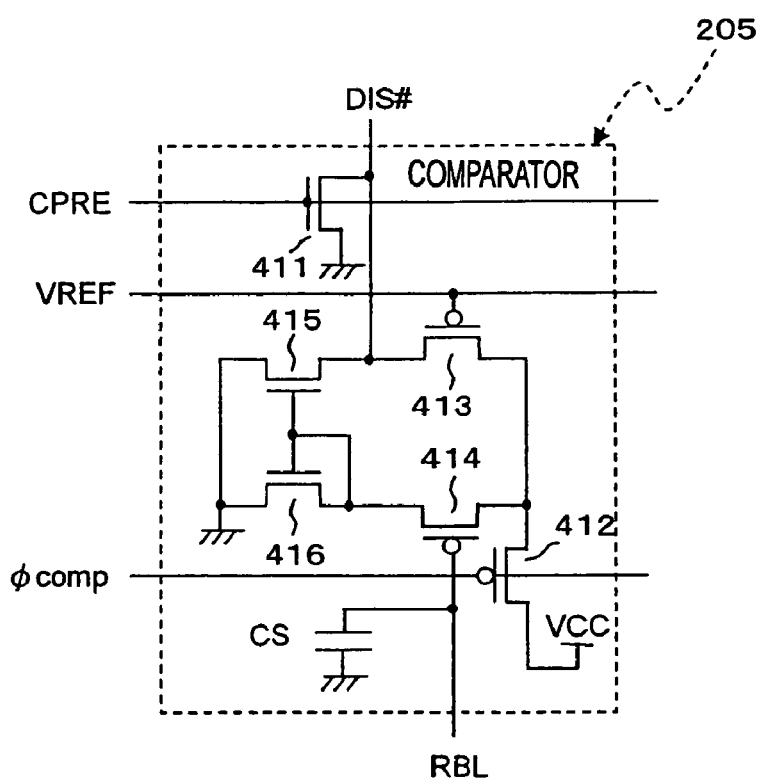
FIG. 4B is a circuit diagram of a comparator shown in FIG. 2.

FIG. 4B shows a circuit diagram of the or each comparator 205 shown in FIG. 2, where the semiconductor storage device has k bit line select circuits 204.

As shown in FIG. 4B, a reset signal CPRE is inputted to the gate of an NMOS transistor 411, and the source of the NMOS transistor 411 is connected to the ground. Also, a signal φcomp is inputted to the gate of a PMOS transistor 412, and a power supply voltage VCC is applied to the source of the PMOS transistor 412. The sources of PMOS transistors 413, 414 are connected to the drain of the PMOS transistor 412. The drain of the NMOS transistor 411 and the drain of a NMOS transistor 415 are connected to the drain of the PMOS transistor 413. The source of the NMOS transistor 415 is connected to the ground. Meanwhile, the drain of an NMOS transistor 416 is connected to the drain of the PMOS transistor 414, and the source of the NMOS transistor 416 is connected to the ground. The gate of the NMOS transistor 415 is connected to gate and drain of the NMOS transistor 416. The bit line RBL is connected to the gate of the PMOS transistor 414, and a capacitor CS is connected between the bit line RBL and the ground. A signal DIS# is outputted from the drain of the PMOS transistor 413.

Figure 4C:
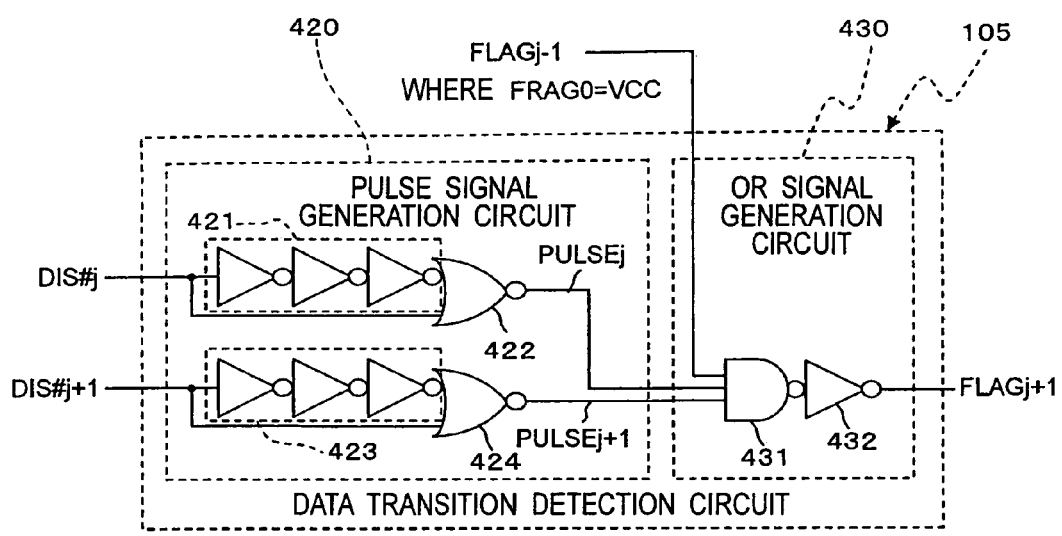
FIG. 4C is a circuit diagram of a data transition detection circuit shown in FIGS. 1 and 2.

FIG. 4C shows a circuit diagram of the or each data transition detection circuit 105 shown in FIGS. 1 and 2, where the data transition detection circuit 105 is provided by k/2 in number.

As shown in FIG. 4C, the data transition detection circuit 105 is composed of a pulse signal generation circuit 420 and an OR signal generation circuit 430. The pulse signal generation circuit 420 has a delay circuit 421 in which a signal DIS#j (j=1, 3, 5, ..., k−1 (odd number only)) is inputted to its input terminal, a NOR gate 422 in which the output terminal of the delay circuit 421 is connected to its first input terminal and in which a signal DIS#j is inputted to its second input terminal, a delay circuit 423 in which the signal DIS#j+1 is inputted to its input terminal, and a NOR gate 424 in which the output terminal of the delay circuit 423 is connected to its first input terminal and in which the signal DIS#j+1 is inputted to its second input terminal. Also, the OR signal generation circuit 430 has a NAND gate 431 in which an OR signal FLAGj−1 is inputted to its first input terminal, a signal PULSEj outputted from the NOR gate 422 of the pulse signal generation circuit 420 is inputted to its second input terminal, and in which a signal PULSEj+1 outputted from the NOR gate 424 of the pulse signal generation circuit 420 is inputted to its third input terminal, and and an inverter 432 whose input terminal is connected to the output terminal of the NAND gate 431 and from the output terminal of which an OR signal FLAGj+1 is outputted. The delay circuits 421, 423 are made up each by three inverters connected in series.

Figure 5A:
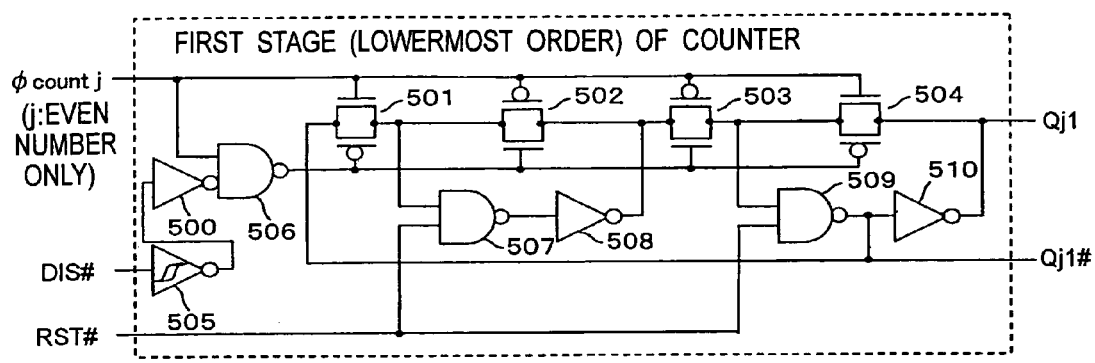
FIG. 5A is a circuit diagram of the first stage (lowermost order) of a counter shown in FIG. 2.

FIG. 5A shows a circuit diagram of the first stage (lowermost order) of the or each counter 206 shown in FIG. 2. As shown in FIG. 5A, a clock signal φcountj (j=0, 2, 4, ..., k (even number only)) is inputted to NMOS-side control input terminals of CMOS transfer gates 501, 504, while the clock signal φcountj is inputted to PMOS-side control input terminals of CMOS transfer gates 502, 503. Also, the signal DIS# is connected to the input terminal of an inverter 505, and the output terminal of the inverter 505 is connected to the first input terminal of a NAND gate 506 via an inverter 500. The inverter 505 is a Schmitt circuit having a hysteresis characteristic in its threshold voltage. The clock signal φcountj is inputted to the second input terminal of the NAND gate 506. Also, the output terminal of the NAND gate 506 is connected to each of PMOS-side control input terminals of the CMOS transfer gates 501, 504 as well as to each of NMOS-side control input terminals of the CMOS transfer gates 502, 503. The other one of the input/output terminals of the CMOS transfer gate 501 is connected to one of the input/output terminals of the CMOS transfer gate 502, and the other one of the input/output terminals of the CMOS transfer gate 502 is connected to one of the input/output terminals of the CMOS transfer gate 503. Further, the other one of the input/output terminals of the CMOS transfer gate 503 is connected to one of the input/output terminals of then CMOS transfer gate 504. The other one of the input/output terminals of the CMOS transfer gate 501 is connected to the first input terminal of a NAND gate 507, and the output terminal of the NAND gate 507 is connected to the other one of the input/output terminals of the CMOS transfer gate 502 via an inverter 508. Also, the other one of the input/output terminals of the CMOS transfer gate 503 is connected to the first input terminal of a NAND gate 509, and the output terminal of the NAND gate 509 is connected to the other one of the input/output terminals of the CMOS transfer gate 504 via an inverter 510. A signal Qj1 (j=1, 2, ..., k) is outputted from the output terminal of the inverter 510. Also, one of the input/output terminals of the CMOS transfer gate. 501 is connected to the output terminal of the NAND gate 509. A signal Qj1# (j=1, 2, ..., k) is outputted from the output terminal of the NAND gate 509.

Then, a reset signal RST# is connected to each of the second input terminal of the NAND gate 507 and the second input terminal of the NAND gate 509.

Figure 5B:
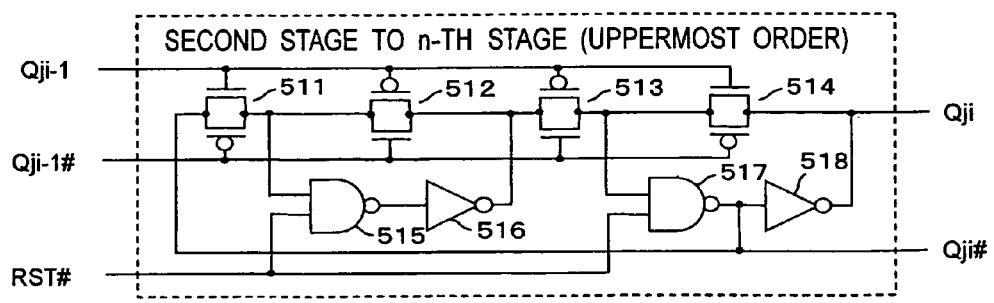
FIG. 5B is a circuit diagram of the second stage to the n-th stage (uppermost order) of the counter.

FIG. 5B shows a circuit diagram of the second stage to the n-th stage (uppermost order) of the counter 206. In this semiconductor storage device, the counter 206 formed as shown in FIGS. 5A and 5B is provided by k in number.

As shown in FIG. 5B, a signal Qji−1 (j=1, 2, ..., k, i=2, 3, ..., n) is inputted to the NMOS-side control input terminals of CMOS transfer gate 511, 514, while the signal Qji−1 is inputted to the PMOS-side control input terminals of CMOS transfer gates 512, 513. Also, a signal Qji−1# (j=1, 2, ..., k, i=2, 3, ..., n) is inputted to PMOS-side control input terminals of the CMOS transfer gates 511, 514, while the signal Qji−1# is inputted to NMOS-side control input terminals of the CMOS transfer gates 512, 513. Also, the other one of the input/output terminals of the CMOS transfer gate 511 is connected to one of the input/output terminals of the CMOS transfer gate 512, and the other one of the input/output terminals of the CMOS transfer gate 512 is connected to one of the input/output terminals of the CMOS transfer gate 513. Further, the other one of the input/output terminals of the CMOS transfer gate 513 is connected to one of the CMOS transfer gate 514. The other one of the input/output terminals of the CMOS transfer gate 511 is connected to the first input terminal of a NAND gate 515, and the output terminal of the NAND gate 515 is connected to the other one of the input/output terminals of the CMOS transfer gate 512 via an inverter 516. Also, the other one of the input/output terminals of the CMOS transfer gate 513 is connected to the first input terminal of a NAND gate 517, and the output terminal of the NAND gate 517 is connected to the other one of the input/output terminals of the CMOS transfer gate 514 via an inverter 518. A signal Qji (j=1, 2, ..., k, i=2, 3, ..., n) is outputted from the output terminal of the inverter 518. Also, one of the input/output terminals of the CMOS transfer gate 511 is connected to the output terminal of the NAND gate 517. A signal Qji# (j=1, 2, ..., k, i=2, 3, ..., n) is outputted from the output terminal of the NAND gate 517. Then, the reset signal RST# is connected to each of the second input terminal of the NAND gate 515 and the second input terminal of the NAND gate 517.

Figure 5C:
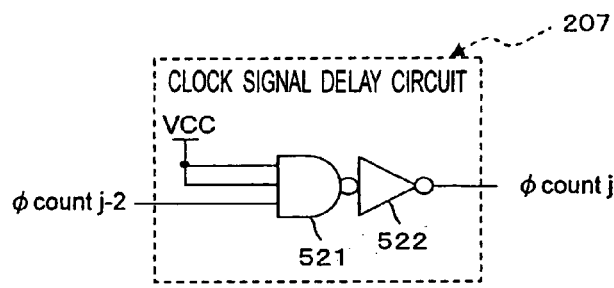
FIG. 5C is a circuit diagram of a clock signal delay circuit shown in FIG. 2.

FIG. 5C shows a circuit diagram of the clock signal delay circuit 207 shown in FIG. 2, where a power supply voltage VCC is applied to first and second input terminals of a three-input NAND gate 521, and a clock signal φcountj−2 (j=2, 4, ..., k (even number only)) is inputted to its third input terminal. The input terminal of an inverter 522 is connected to the output terminal of the NAND gate 521. A clock signal φcountj (j=2, 4, ..., k (even number only)) is outputted from the output terminal of the inverter 522.

Figure 5D:
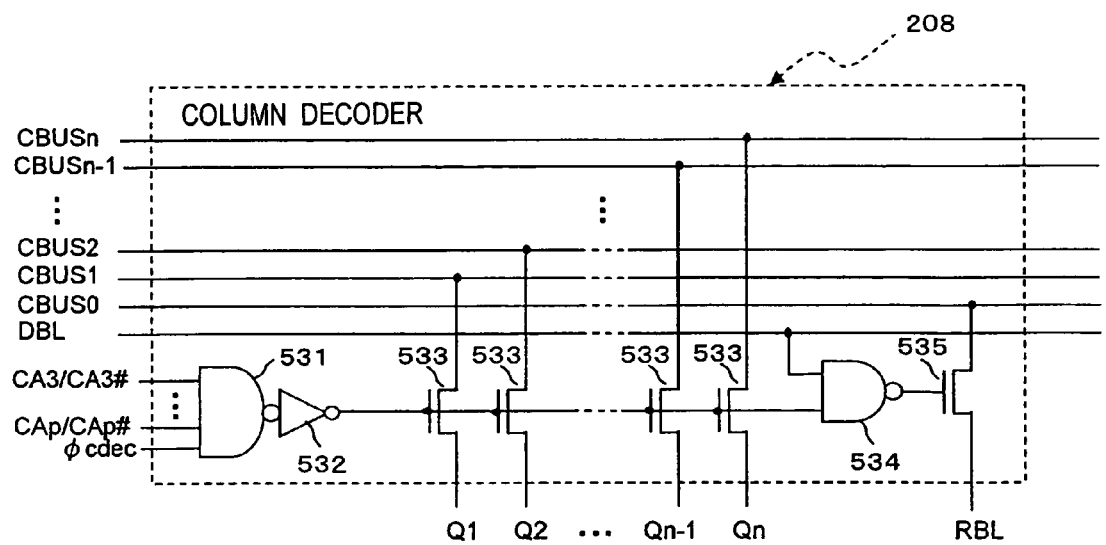
FIG. 5D is a circuit diagram of a column decoder of FIG. 2.

FIG. 5D shows a circuit diagram of the or each column decoder 208 shown in FIG. 2, where the column decoder 208 is provided by k in number in this semiconductor storage device.

As shown in FIG. 5D, the input terminal of an inverter 532 is connected to the output terminal of a NAND gate 531 for decoding column addresses based on signals CA3-CAp and their inverted signals CA3#-CAp# as well as a signal φcdec. The output terminal of the inverter 532 is connected to each of gates of n NMOS transistors 533, and the output terminal of the inverter 532 is connected to the first input terminal of a NAND gate 534. Signals Q1, Q2, ..., Qn−1, Qn are connected to drains of the n NMOS transistors 533, respectively, one after another from the left side. Meanwhile, lines of signals CBUS1, CBUS2, ..., CBUSn−1, CBUSn are connected to sources of the NMOS transistors 533, respectively, one after another from the left side. Also, the second input terminal of the NAND gate 534 is connected to the line of the signal DBL. The gate of an NMOS transistor 535 is connected to the output terminal of the NAND gate 534, and the signal RBL is inputted to the drain of the NMOS transistor 535. The line of the signal CBUS0 is connected to the drain of the NMOS transistor 535.

Figure 6A:
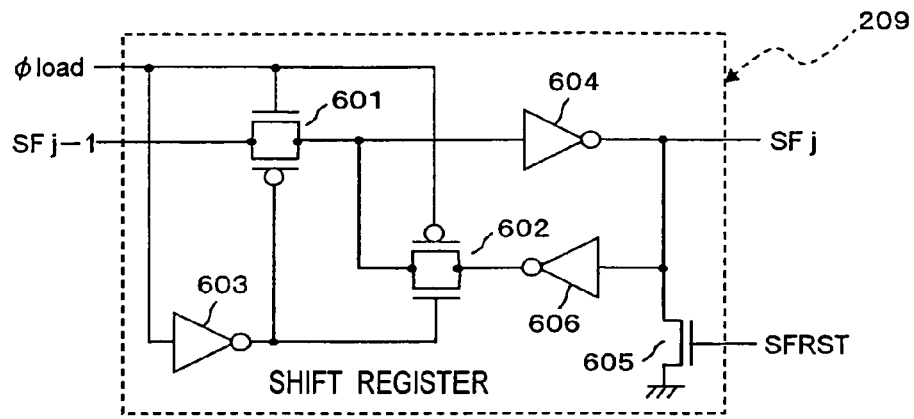
FIG. 6A is a circuit diagram of a shift register shown in FIG. 2.

FIG. 6A shows a circuit diagram of the or each shift register 209 shown in FIG. 2, where the shift register 209 is provided by k in number in this semiconductor storage device.

As shown in FIG. 6A, a signal φload is inputted to an NMOS-side control input terminal of a CMOS transfer gate 601 and a PMOS-side control input terminal of a CMOS transfer gate 602. Also, the signal φload is inputted to the input terminal of an inverter 603, and the output terminal of the inverter 603 is connected to the PMOS-side control input terminal of the CMOS transfer gate 601 and the NMOS side control input terminal of the CMOS transfer gate 602. Also, a signal SFj−1 (j=1, 2, ..., k) is inputted to one of the input/output terminals of the CMOS transfer gate 601, and the other one of the input/output terminals of the CMOS transfer gate 601 is connected to one of the input/output terminals of the CMOS transfer gate 602. The other one of the input/output terminals of the CMOS transfer gate 601 is connected to the input terminal of an inverter 604, and a signal SFj is outputted from the output terminal of the inverter 604. The output terminal of the inverter 604 is connected to the drain of an NMOS transistor 605 whose source is connected to the ground. A reset signal SFRST is inputted to the gate of the NMOS transistor 605. Also, the drain of the NMOS transistor 605 is connected to the input terminal of an inverter 606, and the output terminal of the inverter 606 is connected to the other one of the input/output terminals of the CMOS transfer gate 602.

Figure 6B:
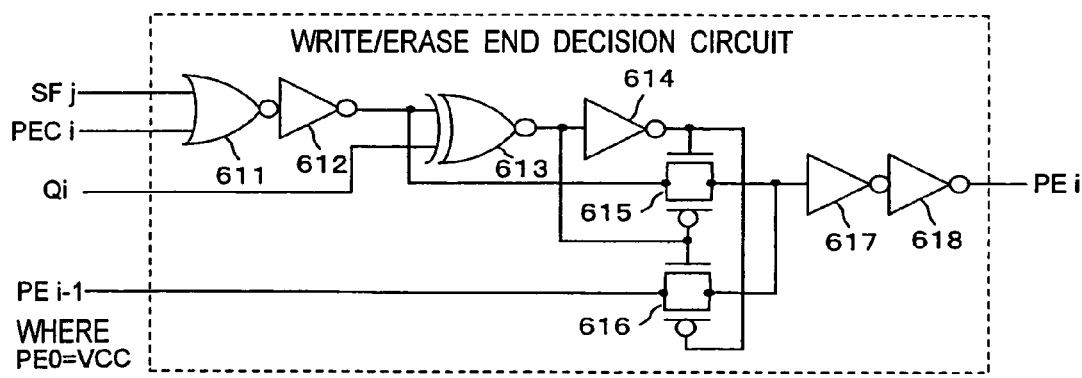
FIG. 6B shows a circuit section of the write/erase end decision circuit of FIG. 2.

FIG. 6B shows a circuit diagram of part of the or each write/erase end decision circuit 210 shown in FIG. 2, where the write/erase end decision circuit 210 is provided by k in number in this semiconductor storage device. It is noted that FIG. 6B shows part (corresponding to one bit) of the write/erase end decision circuit 210, where n circuits of FIG. 6B constitute one write/erase end decision circuit 210.

As shown in FIG. 6B, a signal SFj (j=1, 2, ..., k) and a signal PECi (i=1, 2, ..., n) are inputted to first and second input terminals of the NOR gate 611. The input terminal of an inverter 612 is connected to the output terminal of the NOR gate 611, and the output terminal of the inverter 612 is connected to the first input terminal of an XNOR (exclusive-NOR) gate 613. A signal Qi (i=1, 2, ..., n) is inputted to the second input terminal of the XNOR gate 613. The output terminal of the XNOR gate 613 is connected to the input terminal of an inverter 614, and the output terminal of the inverter 614 is connected to the NMOS-side control input terminal of a CMOS transfer gate 615 and a PMOS-side control input terminal of a CMOS transfer gate 616. The PMOS-side control input terminal of the CMOS transfer gate 615 and the NMOS-side control input terminal of the CMOS transfer gate 616 are connected to the output terminal of the XNOR gate 613. Also, one of the input/output terminals of the CMOS transfer gate 615 is connected to the output terminal of the inverter 612, and the other one of the input/output terminals of the CMOS transfer gate 615 is connected to the input terminal of an inverter 617. The output terminal of the inverter 617 is connected to the input terminal of an inverter 618, and a signal PEi (i=1, 2, ..., n) is outputted from the output terminal of the inverter 618. Also, a signal PEi−1 (i=1, 2, ..., n) is inputted to one of the input/output terminals of the CMOS transfer gate 616, and the input terminal of the inverter 617 is connected to the other one of the input/output terminals of the CMOS transfer gate 616.

Figure 6C:
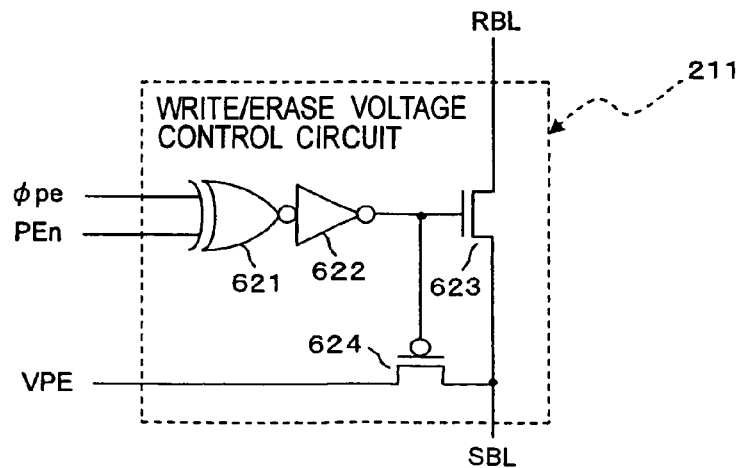
FIG. 6C is a circuit diagram of a write/erase voltage control circuit of FIG. 2.

FIG. 6C shows a circuit diagram of the or each write/erase voltage control circuit 211 shown in FIG. 2, where the write/erase voltage control circuit 211 is provided by k in number in this semiconductor storage device.

As shown in FIG. 6C, a signal φpe and a signal PEn are inputted to first and second input terminals, respectively, of an XNOR (exclusive-NOR) gate 621. The input terminal of an inverter 622 is connected to the output terminal of the XNOR gate 621, and the gate of an NMOS transistor 623 is connected to the output terminal of the inverter 622. The bit line RBL is connected to the source of the NMOS transistor 623, and the select bit line SBL is connected to the drain of the NMOS transistor 623. Also, the gate of a PMOS transistor 624 is connected to the output terminal of the inverter 622. A voltage VPE is inputted to the source of the PMOS transistor 624, and the select bit line SBL is connected to the drain of the PMOS transistor 624.

Figure 7A:
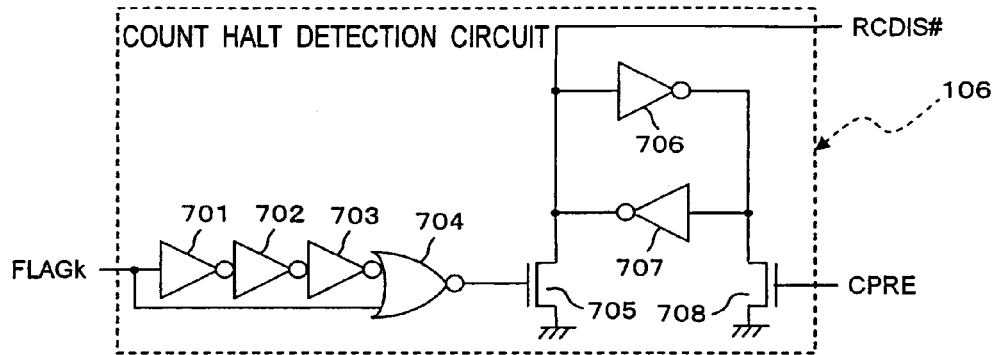
FIG. 7A is a circuit diagram of the count halt detection circuit shown in FIG. 1.

FIG. 7A shows a circuit diagram of the count halt detection circuit 106 shown in FIG. 1. As shown in FIG. 7A, an OR signal FLAGk is inputted to the input terminal of an inverter 701 and the first input terminal of an NOR gate 704. The output terminal of the inverter 701 is connected to the second input terminal of the NOR gate 704 via inverters 702, 703. The output terminal of the NOR gate 704 is connected to the gate of an NMOS transistor 705 whose source is connected to the ground. Also, the drain of the NMOS transistor 705 is connected to the input terminal of an inverter 706 and the output terminal of an inverter 707. A signal RCDIS# is outputted from the drain of the NMOS transistor 705. Also, the output terminal of the inverter 706 is connected to the input terminal of the inverter 707 and the drain of an NMOS transistor 708. A reset signal CPRE is inputted to the gate of the NMOS transistor 708, and its source is connected to the ground GND.

Figure 7B:
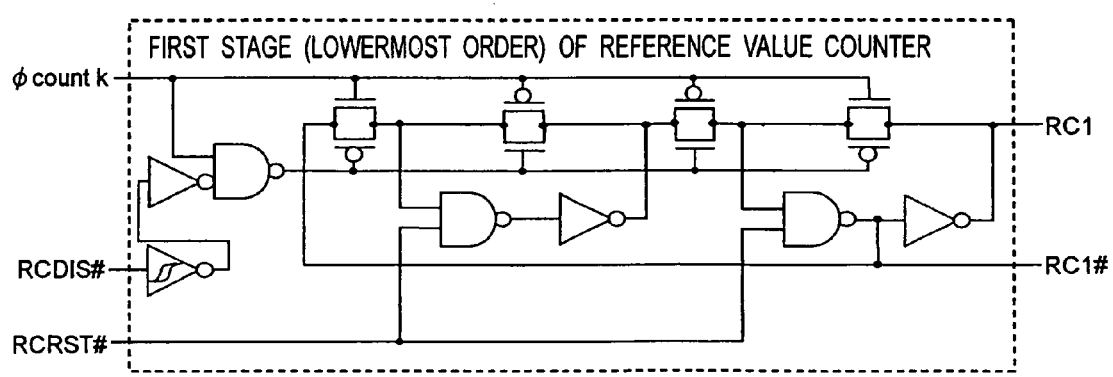
FIG. 7B is a circuit diagram of the first stage (lowermost order) of the reference value counter shown in FIG. 1.
Figure 7C:
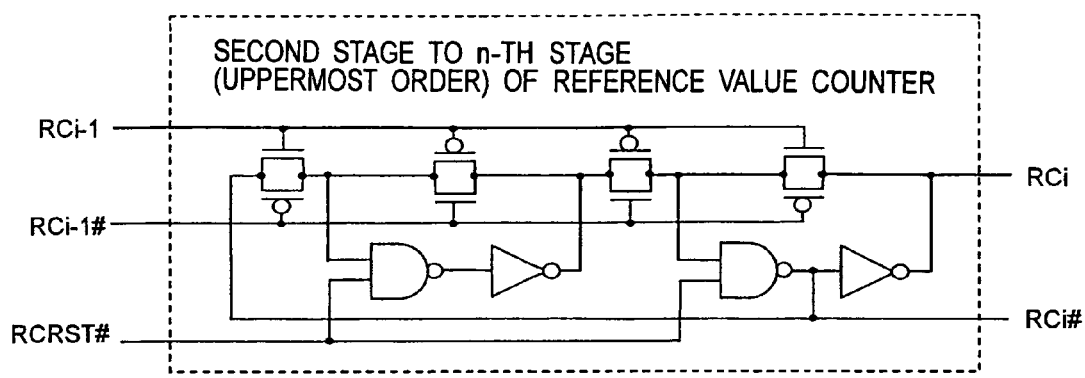
FIG. 7C is a circuit diagram of the second stage to the n-th stage (uppermost order) of the reference value counter.

FIG. 7B shows a circuit diagram of the first stage (lowermost order) of the reference value counter 107 shown in FIG. 1, and FIG. 7C shows a circuit diagram of the second stage to the n-th stage (uppermost order) of the reference value counter 107. The reference value counter 107 shown in FIGS. 7B and 7C is identical in circuit construction to the counter 206 shown in FIGS. 5A and 5B, and so its description is omitted.

Figure 7D:
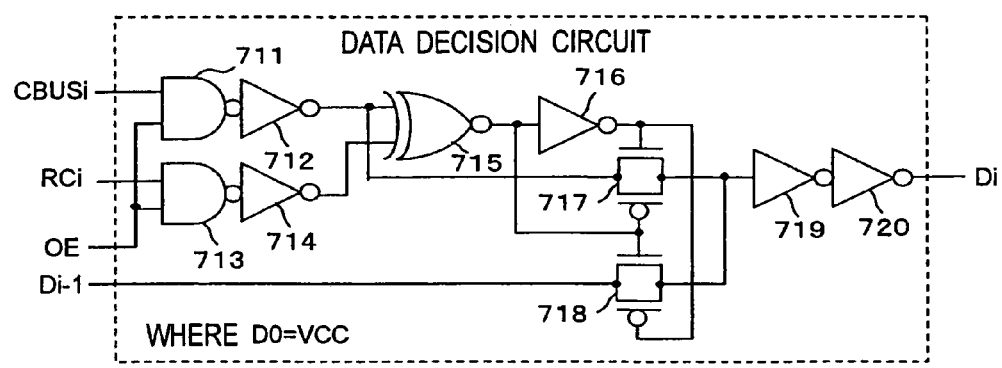
FIG. 7D is a circuit diagram of the data decision circuit shown in FIG. 1.

FIG. 7D shows a circuit diagram of part of the data decision circuit 108 shown in FIG. 1. It is noted that FIG. 7D shows part (corresponding to one bit) of the data decision circuit 108, where n circuits of FIG. 7D constitute one data decision circuit 108.

As shown in FIG. 7D, a signal CBUSi (i=1, 2, ..., n) and a signal OE are inputted to first and second input terminals, respectively, of a NAND gate 711. The output terminal of the NAND gate 711 is connected to the first input terminal of an XNOR (exclusive-NOR) 715 via an inverter 712. Also, a signal RCi (i=1, 2, ..., n) and a signal OE are inputted to first and second input terminals, respectively, of a NAND gate 713. The output terminal of the NAND gate 713 is connected to the second input terminal of the XNOR 715 via an inverter 714. The output terminal of the XNOR 715 is connected to the NMOS-side control input terminal of a CMOS transfer gate 717 via an inverter 716, and the output terminal of the XNOR 715 is connected to the PMOS-side control input terminal of the CMOS transfer gate 717. One of the input/output terminals of the CMOS transfer gate 717 is connected to the output terminal of the inverter 712, the other one of the input/output terminals of the CMOS transfer gate 717 is connected to the input terminal of an inverter 719, and the output terminal of the inverter 719 is connected to the input terminal of an inverter 720. A signal Di (i=1, 2, ..., n) is outputted from the output terminal of the inverter 720. Also, the NMOS-side control input terminal of a CMOS transfer gate 718 is connected to the PMOS-side control input terminal of the CMOS transfer gate 717. The output terminal of the inverter 716 is connected to the PMOS-side control input terminal of the CMOS transfer gate 718. A signal Di−1 (i=1, 2, ..., n) is inputted to one of the input/output terminals of the CMOS transfer gate 718, and the other one of the input/output terminals of the CMOS transfer gate 718 is connected to the input terminal of the inverter 719.

Figure 8A:
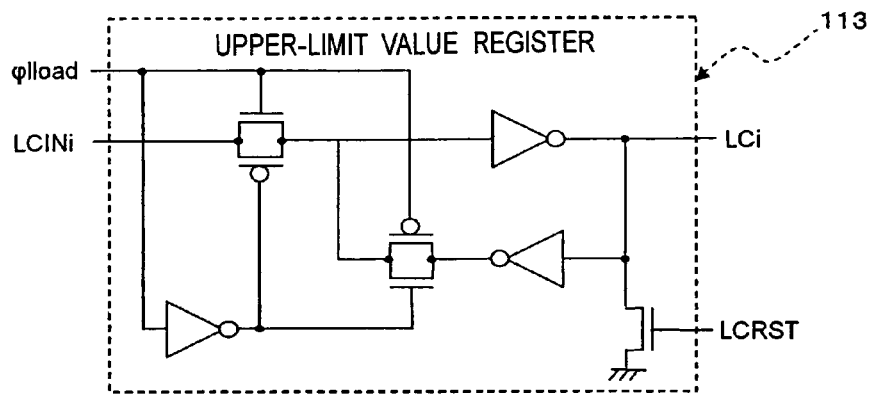
FIG. 8A is a circuit diagram of the upper-limit value register shown in FIG. 1.

FIG. 8A shows a circuit diagram of the upper-limit value register 113 shown in FIG. 1. The upper-limit register 113 shown in FIG. 8A is identical in circuit construction to the shift register 209 shown in FIG. 6A, and so its description is omitted.

Figure 8B:
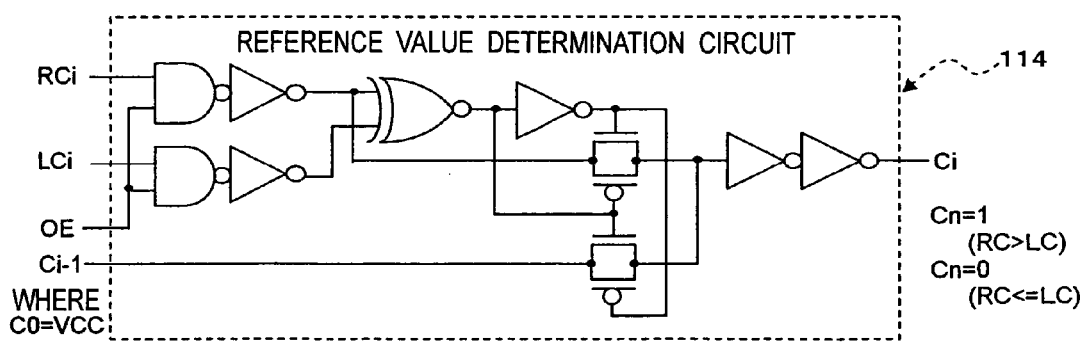
FIG. 8B is a circuit section of the reference value determination circuit of FIG. 1.

FIG. 8B shows a circuit diagram of the reference value determination circuit 114 of FIG. 1. The reference value determination circuit 114 shown in FIG. 8B is identical in circuit construction to the data decision circuit 108 shown in FIG. 7D, and so its description is omitted.

Figure 8C:
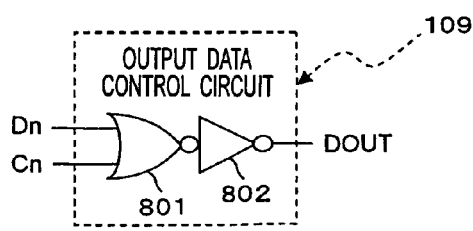
FIG. 8C is a circuit diagram of the output data control circuit of FIG. 1.

Further, FIG. 8C shows a circuit diagram of the output data control circuit 109 of FIG. 1. As shown in FIG. 8C, a signal Dn and a signal Cn are connected to first and second input terminals, respectively, of a NOR gate 801. The output terminal of the NOR gate 801 is connected to the input terminal of an inverter 802, and a signal DOUT is outputted from the output terminal of the inverter 802.

(Read Operation)

FIG. 9 is a timing chart for explaining read operation in the semiconductor storage device of an embodiment of the present invention. In FIG. 9, signal names correspond to the signals of FIGS. 1 to 8, respectively. In this case, it is assumed that memory cells MC00, MC01, . . . , MC08, MC09, . . . connected to a word line WL0 are read out.

First, as shown in FIG. 9, a charging/discharging control signal BLDISj (j=0, 2, 4, . . . , k (even number only)) inputted to the bit line charging/discharging circuit 201 is set fallen to the GND level at time t1 so that all the bit lines BL0–BLk×4 are charged (only the charging/discharging control signal BLDIS0 is shown in FIG. 9), where k represents the number of memory cells read out at a time.

Next, at time t2, the signal φrdec is set high level so that the select word line WL0 is set high to the level of a voltage VWL. Simultaneously with this, the signal φbsel of a bit line select circuit driver 203 is set high level so that the bit line select signals (CUT1-CUT3) other than the selected CUT0 of the bit line select circuit 204 are set fallen to the GND level. As a result of this, the bit line BL0, BL4, . . . is selected, so that only the selected bit line BL0, BL4, . . . is connected to one input side of each corresponding comparator 205. A reference voltage (reference potential) VREF, which is lower than the charge voltage VBL, is preliminarily inputted to the other input side of the comparator 205. Also, the reset signal CPRE of the comparator 205 is set at a power supply voltage level (hereinafter, referred to as VCC level) and the signal DIS# is set at the ground level (hereinafter, referred to as GND level).

Subsequently, at time t3, the reset signal CPRE of the comparator 205 is set fallen to the GND level so that discharge of the line of the signal DIS# is ended, while the signal φcomp is set fallen to a bias voltage VBIAS so that the comparator 205 is operated. Since the bit-line charge voltage VBL and the reference voltage VREF, which is lower than the charge voltage VBL, are inputted to two inputs of the comparator 205, respectively, the signal DIS# is at the VCC level.

Further, at time t4, the reset signal RST# of the counter 206 (shown in FIG. 2) is set high level, so that the counter 206 becomes operable.

Thereafter, at time t5, the charging/discharging control signal BLDISj is set high level so that the discharge of the selected bit line BL0, BL4, . . . is started, while the clock signal φcountj is pulsated so that the count operation of the counter 206 is started. The rising of the charging/discharging control signal BLDISj as well as the timing of pulsating the clock signal φcountj do not necessarily need to be accurately coincident with each other. The reason of this is that the reference value for deciding whether storage information of a memory cell is data 0 or data 1 can appropriately be determined only by determining the count value RCi that is a boundary between data 0 and data 1. It is noted that the counter 206 may be a common up counter (or down counter) as shown in FIGS. 5A and 5B. The counter 206 is made up of n stages corresponding to n bits, each stage being so designed that upon input of one pulse signal from the preceding stage, its output is inverted by one turn ("H" to "L"; or "L" to "H").

As shown above, the selected bit line BL0, BL4, . . . is discharged in response to the magnitude of the cell current of the selected memory cell MC00, MC04, . . . , so that the potential of the bit line BL0, BL4, . . . decreases gradually. Then, when the potential of the bit line BL0 becomes lower than reference voltage VREF+ΔV (where ΔV is an offset voltage of the comparator 205), which is an example of a specified potential, the output of the comparator 205 is inverted, so that the signal DIS# goes GND level. The time of this occurrence is assumed as time t6 in FIG. 9. Then, as the signal DIS# goes GND level, the counter 206 halts the count operation, where at this time point, the count value Cji (j=0, 1, . . . , k, i=1, 2, . . . , n) corresponding to the cell current of the memory cell MC00 is held in each counter 206. It is noted that the offset voltage ΔV of the comparator 205 is ordinarily about ±several mV or so, being no problem in terms of precision.

The precision of the counter 206 may appropriately be enhanced either by increasing the bit number n or by increasing the discharge time of bit lines. One method for increasing the discharge time of bit lines is to actively increase the capacity of the bit line, i.e., to provide a capacity element (CS in FIG. 4B). When the cell current of the memory cell is 10 μA as an example, a drop of the bit line voltage to VBL/e≈0.44 V takes about 60 ns, where the bit line parasitic capacitance CB=0.5 pF and the charge voltage VBL=1.2 V. Further, with the provision of CS=0.5 pF, the discharge time is doubled to about 120 ns, so that the counter 206 can be increased in bit number by 1, hence doubled in precision, without increasing the power consumption of the counter 206 (with the frequency kept unchanged).

Also, since the discharge time of bit lines is generally inversely proportional to the cell current, the discharge time shortens more and more with increasing cell current, while the discharge time increases with decreasing cell current so that the precision becomes better. Therefore, as shown in FIG. 3A, a transistor block TRa composed of four NMOS transistors are provided in the bit line charging/discharging circuit 201, where the current flowing through an NMOS transistor of the transistor block TRa is set to between maximum and minimum values of the cell current of a memory cell that is to be measured by controlling the size of the NMOS transistor and the voltage VDB applied to its gate. By doing so, not only the discharge time of the bit line becomes longer but also the worsening of the precision due to the magnitude of the cell current of the memory cell can be relaxed. Instead of providing the transistor block TRa, effects similar to those of the transistor block TRa can be obtained also by adjusting the transistor size of the transistor block TRb (which is generally set so as to allow a sufficiently larger current to flow therethrough, in comparison to the cell current) that controls the discharge of the bit lines.

Meanwhile, the signal DIS# is inputted also to the data transition detection circuit 105, and a pulse is outputted as an OR signal FLAG2. This OR signal FLAG2 is inputted to the neighboring data transition detection circuit 105, being propagated from one to another so as to be inputted to the count halt detection circuit 106 finally as an OR signal FLAGk as it is ORed with the pulse signal derived from other memory cells. Whereas the signal RCDIS# outputted from the count halt detection circuit 106 is reset to the VCC level by the reset signal CPRE, the count halt detection circuit 106, upon input of a pulse to the OR signal FLAGk, detects its tailing edge, where the signal RCDIS# goes GND level. As a result of this, the reference value counter 107 halts counting and holds the count value RCi (i=1, 2, . . . , n) resulting at a trailing edge time point of the OR signal FLAGk. It is noted that the reference value counter 107 is similar in construction to the counter 206, but different therefrom in that the reference value counter 107 operates on a clock signal φcountk which is delayed from the clock signal φcountj by the clock signal delay circuit 207. In addition, the reason that the delayed clock signal φcountk is used will be described later in the section of "Detection of Reference Value."

Now, each of the clock signals φcount0, φcount2, . . . , φcountk (k is the number of memory cells to be read at a time) goes constant at GND level at a time point when the number of times of the pulse signal reaches 2n−1, so that the count operation of the counter 206 and the reference value counter 107 for the selected memory cells MC00, MC04, . . . is ended.

Thereafter, the signal φcdec is set high level at time t7, where the column decoder 208 is controlled to read the count values Cji (j=0, 1, . . . , k, i=1, 2, . . . , n) of the individual counters 206 from the bus line of the signals CBUSi (i=1, 2, . . . , n).

Whereas the signal DBL is normally set at the VCC level, lowering the signal to the GND level allows selected bit lines to be outputted directly to peripheral circuits via the line of the signal CBUS0 by virtue of the function of the bit-line potential output circuit of the column decoder 208. As a result of this, it becomes practicable to directly measure the cell currents of individual memory cells by peripheral circuits or measuring instruments outside the chip, thus making it practicable to do debug or correction of circuits, measurement of detailed memory cell characteristics and the like.

Further, when the signal OE goes high level at time t8, the count value Cji is once inputted to the data decision circuit 108, where the count value Cji is compared with the count value RCi of the reference value counter 107 and converted from the count value to a binary value. The result of this is fed to the output data control circuit 109 as a signal Dn. At the same time, the count value RCi of the reference value counter 107 is inputted also to the reference value determination circuit 114, where the count value RCi is compared with an output signal LCi derived from the upper-limit value register 113 and the result of this is fed to the output data control circuit 109 as a signal Cn. Normally, a write count value PC has been held in the upper-limit value register 113 (the reason of this will be described later in the section of "Detection of Reference Value").

Next, in the output data control circuit 109, if it is decided depending on the signal Cn outputted from the reference value determination circuit 114 that the count value RCi of the reference value counter 107 is larger than the signal LCi outputted from the upper-limit value register 113, all the data are regarded as "1" and a signal DOUT (=1) is outputted regardless of the value of the signal Dn outputted from the data decision circuit 108. Conversely, if the count value of the reference value counter 107 is smaller than the value of the upper-limit value register 113, then the signal Dn is outputted as a signal DOUT from the data decision circuit 108.

(Write Operation and Erase Operation)

Next, write operation and erase operation of the semiconductor storage device are explained. For concreteness and easiness of the explanation, write operation and erase operation are described below on the assumption that memory cells in this embodiment are of a side wall memory, which is a kind of flash memory.

In particular, write operation is described on a case where the write operation is performed on a multiplicity of memory cells at a time on the basis of a word line unit. However, in the case where the virtual ground method is used as shown in FIG. 2, memory cells to be written at a time are, for example, ¼ out of the memory cells connected to one identical word line. It is noted here that the side wall memory refers to a memory having a source region, a drain region, a channel region formed between the source region and the drain region, a gate formed on the channel region, and charge retention regions formed on both sides of the gate. In addition, the memory cells may be nonvolatile memory cells of any other kind or of the fixed ground method. In any case of these, the resulting electrical influence is no more than a change in applied voltage and, therefore, this is not limitative for the present invention.

Figure 10:
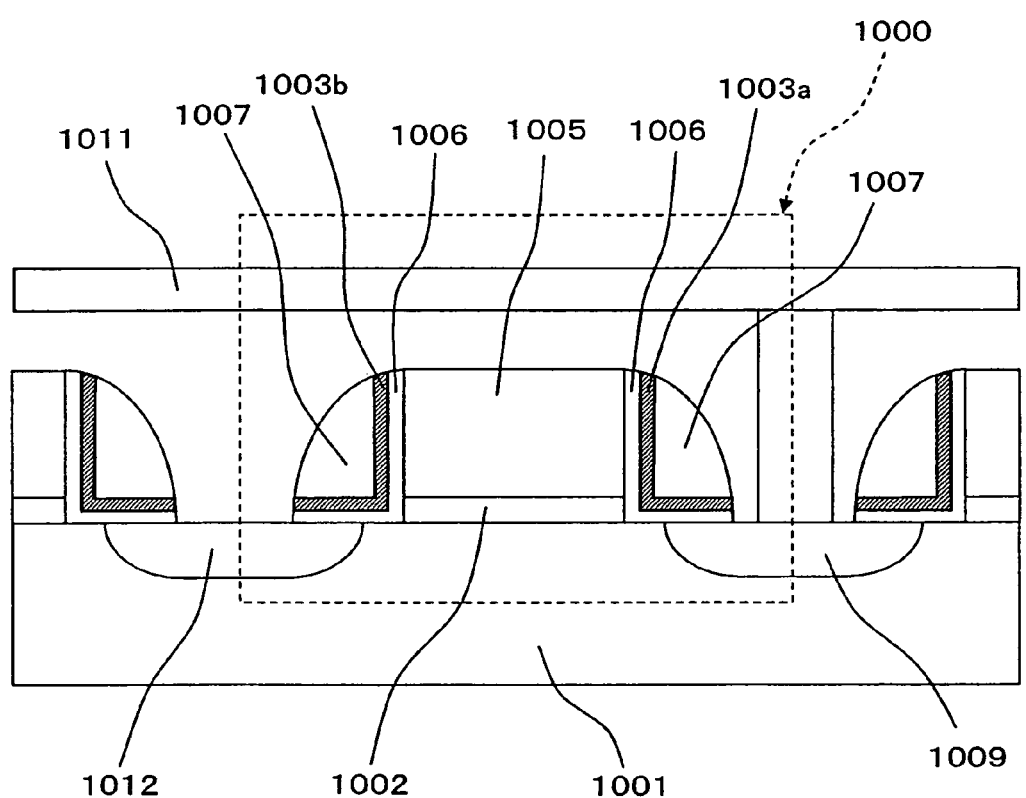
FIG. 10 is a sectional view of a side wall memory to be used in the semiconductor storage device.

FIG. 10 shows a sectional view of a side wall memory in the semiconductor storage device. In this side wall memory, as shown in FIG. 10, one memory cell 1000 includes first, second silicon nitrides 1003a, 1003b serving as the charge retention regions to store 2-bit information therein. In this side wall memory, on a substrate 1001, a word line 1005 made of polysilicon functioning as a gate electrode is formed via a gate insulator 1002. On both sides of the word line 1005, first, second silicon nitrides 1003a, 1003b are formed via silicon oxide 1006. Each of the first, second silicon nitrides 1003a, 1003b has a longitudinal portion extending generally parallel to a side wall of the word line 1005, and a lateral portion adjoining to a lower end of the longitudinal portion and extending so as to go further away from the word line 1005 in a direction generally parallel to the surface of the substrate 1001, thus forming a generally L-shaped configuration. On the farther sides of the first, second silicon nitrides 1003a, 1003b from the word line 1005, there are provided silicon oxides 1007, 1007, respectively. By the first, second silicon nitrides 1003a, 1003b each being sandwiched by the silicon oxides 1006, 1007 as shown above, the charge injection efficiency in rewrite operation is enhanced so that high-speed operation becomes implementable. On the substrate 1001, two diffusion regions are formed in adjacency to the first, second silicon nitrides 1003a, 1003b. More specifically, a diffusion layer 1009 is formed so as to overlap with part of the lateral portion of the first silicon nitride 1003a and to overlap with part of the lateral portion of the silicon nitrides of neighboring memory cells. Further, a second bit line 1012 is formed so as to overlap with part of the lateral portion of the second silicon nitride 1003b and to overlap with part of the lateral portion of silicon nitride of the neighboring memory cell. The diffusion layer 1009 and the second bit line 1012 function as a source region or a drain region, respectively. A channel region is defined between the diffusion layer 1009 and the second bit line 1012 functioning as a source region or a drain region. The diffusion layer 1009 is connected to a first bit line 1011 formed above the memory cell.

For instance, data of the first silicon nitride 1003a is written, erased or read with such a voltage as shown in Table 1 applied to the word line 1005, the first bit line 1011 and the second bit line 1012. For data of the second silicon nitride 1003b, voltages of the first, second bit lines 1011, 1012 may appropriately be replaced with each other in Table 1. In flash memory, since erase is done normally on the basis of a large memory cell array unit called block, a voltage of 5 V is applied to both first and second bit lines 1011, 1012 in erase operation.

TABLE 1

|  | Word | First bit line | Second bit line |
| --- | --- | --- | --- |
| Read Verify | 3 V | 0 V | 1.2 V |
| Write | 5 V | 5 V | 0 V |
| Erase | −5 V | 5 V | 5 V |

Write operation and erase operation in flash memory are carried out while whether the write or the erase has been done enough is checked by read operation that is called verify. Since write characteristic and erase characteristic vary from memory cell to memory cell, the voltage application to the bit line for a memory cell with which write or erase has been ended is stopped (the voltage of the bit line is set to 0 V in the case of Table 1), for example, each time the memory cell is verified. In addition, in a case of erase in the block unit, although the verify is not done to such a degree of fineness, it is assumed here for an easier understanding that the voltage of the bit line is controlled $1k$ as in write operation.

Whereas cell currents flowing through memory cells are varied between write cells and erase cells, it is assumed below that the current for write cells is smaller than the current for erase cells as it is adopted in side wall memories. Accordingly, because write cells become smaller in cell current and longer in discharge time, the count value of the counter 206 is larger in write cells than in erase cells. Thus, a lower-limit value of the count value corresponding to the cell current for write cells is retained in the PC value register 110 of FIG. 1 as a write end decision value (hereinafter, referred to as PC value). Also, an upper-limit value of the count value corresponding to the cell current for erase cells is retained in the EC value register 111 of FIG. 1 as an erase end decision value (hereinafter, referred to as EC value) Then, one of the PC value and the EC value is selected by the multiplexer 112 depending on the signal φpe (e.g., "1" for write, "0" for erase), and inputted to the write/erase end decision circuit 210 as an end decision value PECi (n-bit value, i=1, 2, ..., n).

Meanwhile, in the shift register 209 shown in FIG. 2, upon a reset by the reset signal SFRST, all the signals SFj (j=1, 2, ..., k) outputted from the shift register 209 are "0," and those may be as they are for erase operation. For write operation, input data DIN# are preliminarily inputted to the shift register 209 by φload so that the signals become "1" only for places corresponding to memory cells which are to be inhibited from write.

In verify of write operation and erase operation, count values Qi (n-bit values, i=1, 2, ..., n) corresponding to the cell currents are read to the counter 206 by performing the operations of up to the time t7 as in the foregoing read operation. In the write/erase end decision circuit 210, a comparison between the count value Qi and the end decision value PECi is made, where if Qi≦PECi, then PEn="1" is outputted, while if Qi>PECi, then PEn="0" is outputted. Further, in the write/erase voltage control circuit 211, memory cells that need to be written or erased are detected from the signal PEn and the signal φpe, and the voltage VPE is applied to the bit lines.

(Detection of Reference Value)

In the semiconductor storage device of the invention, an actual distribution of cell current values of memory cells is checked for each read operation without using any reference cell to detect a reference value for decision of data 1 and data 0. The concept for that is explained with reference to FIGS. 11A to 1C and FIG. 12.

Figure 11A:
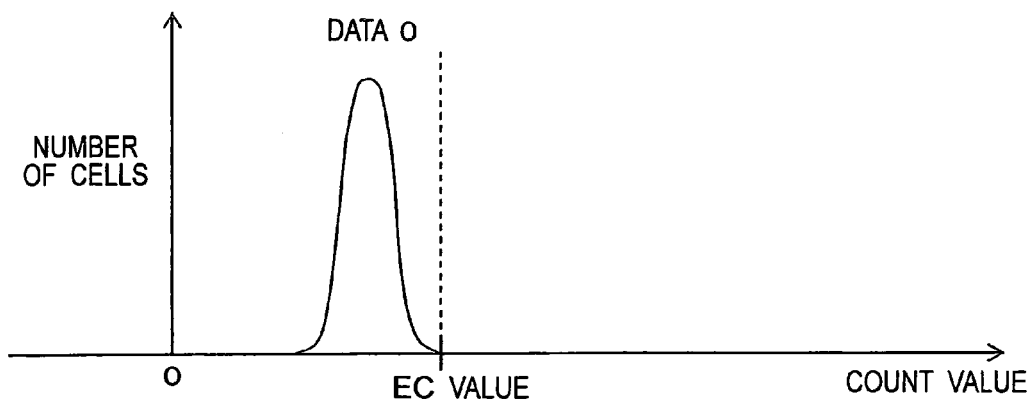
FIG. 11A is a distribution chart of count values of memory cells after an erase in the semiconductor storage device.
Figure 11B:
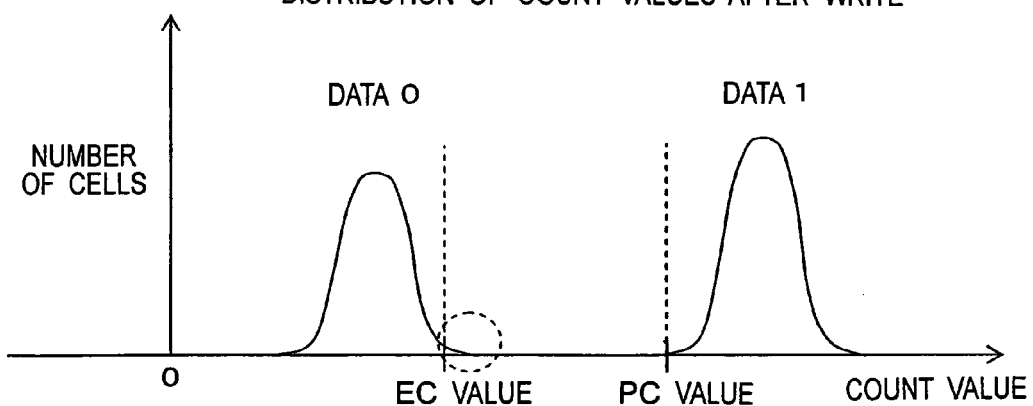
FIG. 11B is a distribution chart of count values of memory cells after a write in the semiconductor storage device.
Figure 11C:
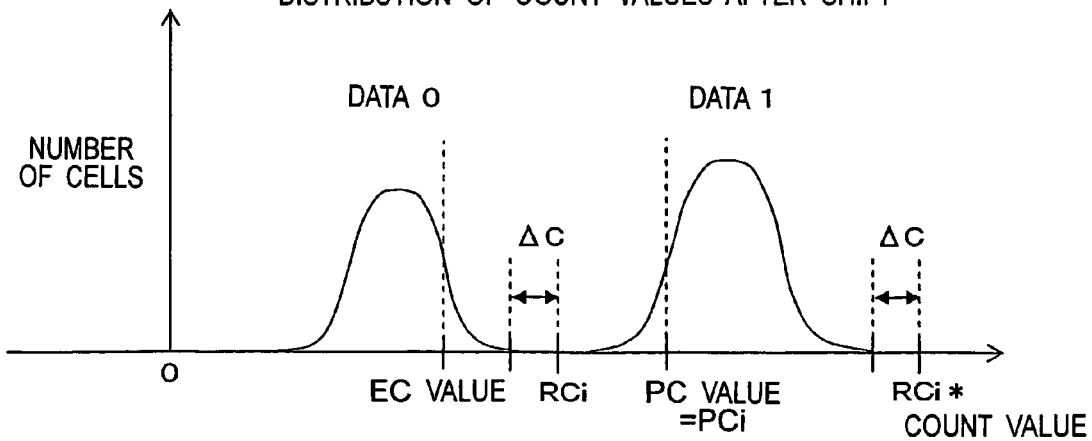
FIG. 11C is a distribution chart of count values of memory cells after a shift in the semiconductor storage device.

FIG. 11A to 11C each show an example of the distribution chart of count values of memory cells in the semiconductor storage device of this embodiment. FIG. 11A is a distribution chart after an erase, FIG. 11B is a distribution chart after a write, and FIG. 11C is a distribution chart after a shift.

Figure 12:
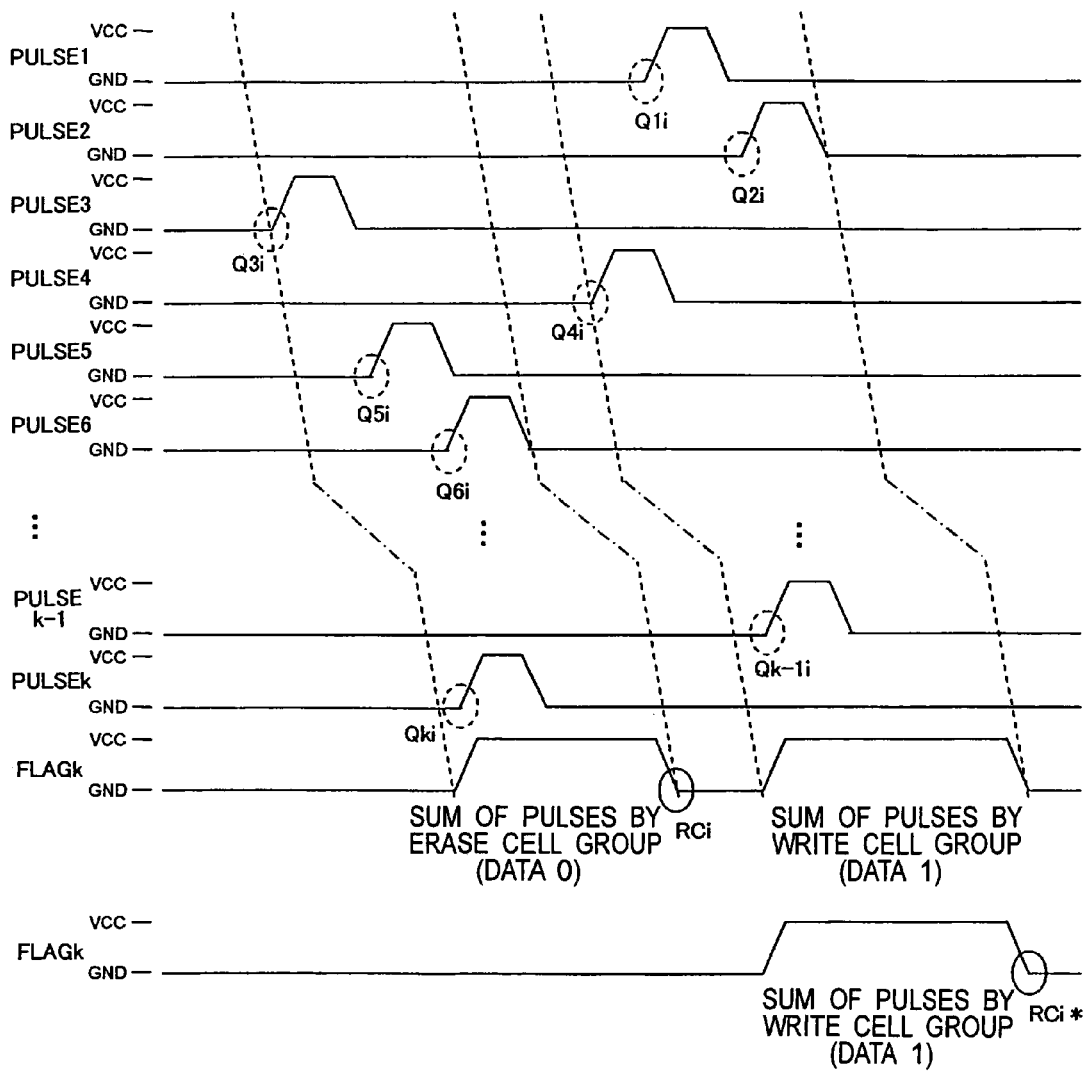
FIG. 12 is a waveform chart in a read operation in the semiconductor storage device.

FIG. 12 is a waveform chart in a read operation in the semiconductor storage device of this embodiment, where signals PULSE1-PULSEk and an OR signal FLAGk show a waveform chart in the case where erase cells (data 0) and write cells (data 1) are present, and another OR signal FLAGk given below shows a waveform chart of write cells (data 1) only.

In FIGS. 1A to 11C, a distribution of cell current values of memory cells to be read at a time is converted into a distribution of count values by the counter 206. Accordingly, in FIGS. 11A to 11C, the horizontal axis represents count values, and the vertical axis represents the numbers of cells corresponding to those count values. In this case, the cell current values of erase cells (data 0) are larger than that of write cells (data 1), so that count values of write cells are larger than that of erase cells.

Immediately after an erase, because a verify has been done so that all the memory cells have count values smaller than a set EC value, the resulting distribution of count values is placed on the left side of an upper-limit value, where the EC value is taken as the upper-limit value, as shown in FIG. 11A. Next, as write operation is performed, memory cells in which data 1 has been written are verified so as to have count values larger than the set PC value, so that the resulting distribution of data 1 is placed on the right side of a lower-limit value, where the PC value is taken as the lower-limit value, as shown in FIG. 11B.

However, since memory cells having data 0 remaining as it is undergo disturb during write of other memory cells so that the distribution is slightly shifted, some of the memory cells having data 0 have their distribution moved on the right side of the EC value (encircled by broken line in FIG. 11B). Further, with time elapsed, the distribution of count values are shifted to larger extents due to disturb from neighboring word lines, disturb by read of themselves, or endurance and other reasons, so that some of the memory cells having data 1 may be placed on the left side of the PC value as shown in FIG. 11C. It is assumed here that there is no such a shift as data 0 and data 1 are overlapped with each other.

Now, assume that read operation is performed in the state after the shift shown in FIG. 11C. As described in the section of "Read Operation," when the signal DIS# of the comparator 205 is inverted, pulse signals PULSEj are generated in the first-half circuit section of the data transition detection circuit 105. As shown in FIG. 12, those pulse signals, including PULSE1 to PULSEk (where k is the number of memory cells to be read at a time), are generated independently from one another in correspondence to cell current values of the individual memory cells. In the second-half circuit section of the data transition detection circuit 105, these pulse signals are ORed and outputted as an OR signal FLAGk from the final stage of the data transition detection circuit 105.

However, the individual signals PULSEj are propagated with time delay resulting from a wiring delay from one end to the other end of the column circuit section 103 and a delay of the ORing logic circuit in combination, as represented by broken line in FIG. 12. Therefore, the charging/discharging control signal delay circuit 202 and the clock signal delay circuit 207 shown in FIG. 2 are used to artificially make wiring delay and logic circuit delay, so that the discharge of the bit lines BL0, BL1, ... as well as the count operation of the counter 206 are delayed in accordance with the broken lines of FIG. 12. As a result of this, the time that has been taken in actual discharge can accurately be measured and stored as a count value in the counter 206. Also, a distribution of cell current values of the memory cells can accurately be outputted in the form of the OR signal FLAGk.

Now, reference character ΔC shown in FIG. 11C represents the pulse width of the pulse signals PULSEj. This width is adjusted at the delay circuit 421 part of FIG. 4C. Although the write operation and the erase operation are adjusted by verify so that their count values become generally identical to each other (where the distribution width of count values become narrower with smaller numbers of memory cells), there can be cases, with an extremely small number of cells of the same data, where the distribution crest of count values is divided into plural ones regardless of the same data. The value of ΔC has to be adjusted so that the waveform of the OR signal FLAGk is outputted in a form that fills such unnecessary gaps.

Conversely, gaps between distributions of data 0 and data 1 has to be larger than ΔC.

Next, in the count halt detection circuit 106 to which the OR signal FLAGk is to be inputted, a signal RCDIS# is generated by detecting a first-time trailing edge of the OR signal FLAGk (an upper-limit value of pulses of erase cells) and outputted to the reference value counter 107. The reference value counter 107, which performs count operation by means of the clock signal $\phi$countk adjusted to wiring delay and logic circuit delay, is enabled to output the upper-limit value of pulses by the erase cells accurately as the count value RCi. Accordingly, with this count value RCi taken as a reference value, memory cells having count value smaller than the reference value can be decided as data 0, and memory cells having larger count values can be decided as data 1 (see FIG. 11C).

However, in the case where all the memory cells have data 1, the OR signal FLAGk results in one pulse and a count value RCi* is outputted, like the waveform shown on the lowermost side of FIG. 12.

On the other hand, in the case where memory cells of data 0 are included, the count value RCi does not become larger than the PC value (distributions of data 0 and data 1 are not overlapped with each other even after the shift of distribution). In this case, for example, the PC value, which is a write end decision value, is preliminarily stored in the upper-limit value register 113. Then, the count value RCi and the output signal LCi derived from the upper-limit value register 113 (PC value in this case) are compared with each other by the reference value determination circuit 114, where if RCi>LCi, then it is decided that all the memory cells have values of data 1. A signal Cn (=1) is outputted from the reference value determination circuit 114, and a signal DOUT (=1) is outputted by the output data control circuit 109 regardless of the value of the signal Dn outputted from the data decision circuit 108.

In addition, in a side wall memory, when stored information of, for example, the first silicon nitride 1003$a$ is to be read out, the cell current is determined depending primarily on stored information of the first silicon nitride 1003$a$ close to the GND level, but it is influenced by the storage state of the second silicon nitride 1003$b$.

Figure 13:
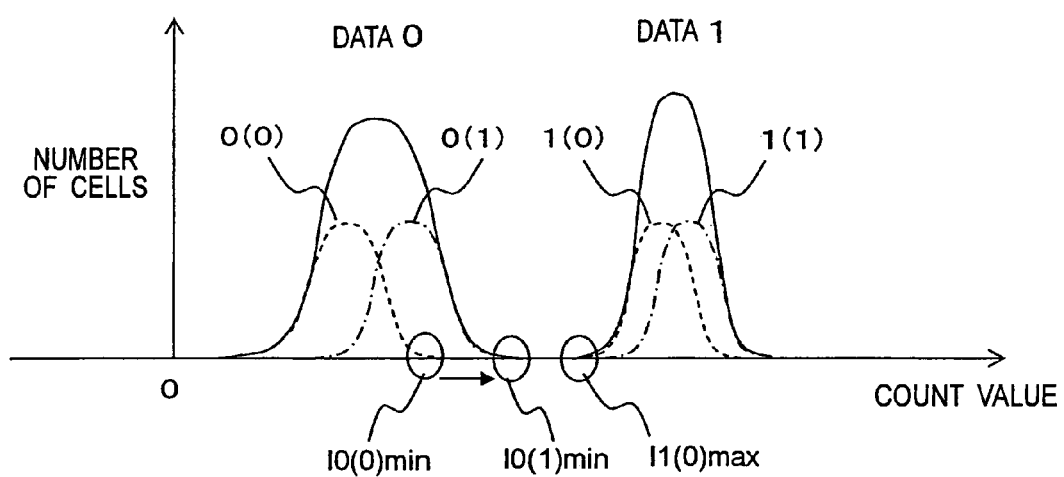
FIG. 13 is a distribution chart of count values of side wall memory constituting in the semiconductor storage device.

FIG. 13 shows a state of such influence. In this case, a state of a small count value is assumed as data 0, while a state of a large count value is assumed as data 1. A parenthesized value denoted by data 0(0) and data 0(1) ot the like represents a storage state of the second silicon nitride 1003$b$.

For instance, if the second silicon nitride 1003$b$ is in the state of data 0 at all times, then a minimum difference of cell current between data 0 and data 1 is I0(0)min–I1(0)max, whereas if the case where the second silicon nitride 1003$b$ is in the state of 1 is included, then the difference becomes I0(1)min–I1(0)max so that the gap between distributions of cell current values is narrowed. Accordingly, with the conventional technique using the cell current value of a reference cell, the inclusion of variations among word lines would make it quite difficult to distinguish between data 0 and data 1. However, applying the semiconductor storage device of the invention allows the distribution of cell current values to be read as a count value, so that the data can accurately be read out even with the distribution varied among word lines.

As described above, according to the semiconductor storage device of this invention, even if cell current distributions are varied among word lines or changed with time, data read can be implemented without any reference cell and therefore without involving any increase in the chip area, as far as the distributions are not overlapped with one another among different data. Still more, since the reference value for distinguishing distributions of count values (generally inversely proportional to cell currents) corresponding to data 0 and data 1 can be detected within the discharge time of bit lines, data read and verify can be accomplished at high speed with almost no loss of access time.

As apparent from the above description, memory cells to be used in the semiconductor storage device of this invention may be memory cells for mask ROM only if those are memory cells through which a constant cell current flows. Moreover, neither the type of nonvolatile memory (NOR type, NAND type, AND type, DINOR type, side wall type, etc.) nor the physical position (nitride, floating gate of polysilicon, etc.) where charge is stored is not limitative. Furthermore, the invention is not limited by whether the bit lines are provided in the fixed ground method or in the virtual ground method, nor is it by whether stored information is in binary value or in multi-level value, or the like. Still more, although the discharge time of bit lines is counted by counters in the description of "Read Operation" above, yet the discharge time may be counted by counters in a method in which select bit lines only are charged.

(Applications to Digital Camera, Digital Recorder, Portable Telephone)

A description will be given below on a case where the semiconductor storage device of the invention is applied to a flash memory for use in digital cameras, digital recorders, portable telephones and the like.

Figure 14:
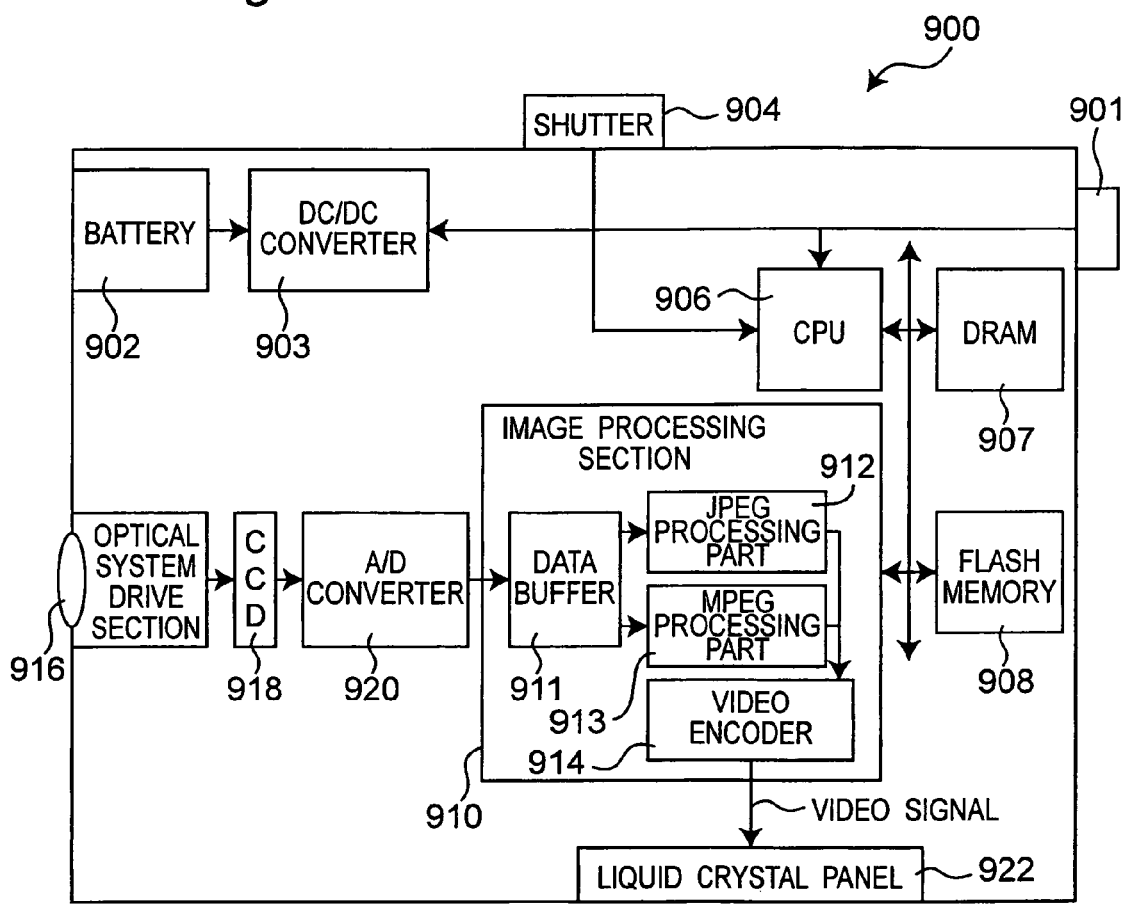
FIG. 14 is a block diagram showing a digital camera as an example of electronic equipment according to an embodiment of the invention.

FIG. 14 shows a block diagram of a digital camera 900 which is an example of electronic equipment as a typical example. When a power switch 901 of the digital camera 900 shown in FIG. 14 is turned on, electric power is fed to the whole system from a battery 902 via a DC/DC converter 903. An image inputted through a lens 916 is converted into an electric current by a CCD 918 (charge coupled device) to become a digital signal through an A/D (analog-to-digital) converter 920, and inputted to a data buffer 911 of an image processing section. Further, a digital signal outputted from the data buffer 911 is processed in an MPEG processing part 913 by motion video processing, and thereafter converted into a video signal by a video encoder 914. Then, based on the video signal derived from the video encoder 914, an image is displayed on a liquid crystal panel 922. Next, when a shutter 904 is pressed, the video is captured as a still picture, passed through a JPEG processing part, and recorded in a flash memory 908.

In the flash memory 908, system programs and the like are also recorded in addition to shot image information. A DRAM 907 (Dynamic Random Access Memory) is used as temporary storage for data that are generated in various process stages of a CPU 906 or an image processing section 910.

In the flash memory used as a semiconductor storage device in the electronic equipment of the invention, image information or audio information or the like of large information amounts (bit capacities) is recorded in many cases as shown above, where large data are written, read or erased collectively. In read operation in this flash memory, reading data of memory cells connected to one word line takes longer first access time (about 100 ns to several μs) that elapses until front leading data is outputted, as compared with ordinary DRAMs and the like.

However, in succeeding second access and the followings, since the count value for distinguishing binary values or multi-level values is determined, count values read from individual memory cells are outputted while being converted into binary values or multi-level values one after another, so that data can be outputted at access time (about 10 ns to several 10's ns) similar to those of DRAMs and the like. Therefore, the longness of the first access is negligible for averaged access time. For instance, given a first access of 1 μs and second and following accesses of 30 ns, simultaneously reading information of 256 memory cells from one word line involves an average access time of 34 ns (≈(1 μs+30 ns×255), which is of no problem in reading large data such as image data.

On the other hand, for mass storage that treat large data such as images, audio and the like, the chip area has to be reduced as much as possible from the necessity of decreasing the bit unit price. Also, in terms of its portability, power consumption has to be reduced for prolonged life of the battery. Further, since even one pixel of error, if included in the image transfered to the liquid crystal panel, is quite noticeable for human eyes, data reliability including longtime preservability has to be enhanced. In portable-telephone use flash memories which are widely used for preservation of image data, similarly, communication protocols and the like are also recorded therein, and therefore high reliability is required therefor as well.

In this semiconductor storage device of the invention, which uses neither reference cell that would be used in the prior art nor circuits for adjusting the cell current value of the reference cell, can suppress increases in chip area and power consumption and moreover memory cell information can accurately be read out even if the distributions of cell currents are varied among word lines or changed with time. Thus, there can be realized a semiconductor storage device having high reliability.

Also, transition of an output signal from the comparator 205 is detected by the data transition detection circuits 105, and based on a signal representing the transition of the output signal, the reference value for determination of information stored in each of a plurality of memory cells is counted by the reference value counter 107. The transition of the output signal derived from the comparator 205 shows a timing at which the bit line potential is changed by discharge (or charge) so as to be smaller (or larger) than the reference potential. By starting the counting of the reference value counter 107 upon a start of discharge and halting the counting of the reference value counter 107 at a timing of transition of the output signal from the comparator 205, it becomes implementable to count the count value corresponding to the discharge period (or charge period). Accordingly, for a plurality of memory cells selected by a word line, it becomes implementable to obtain a reference value for determination of stored information in a plurality of memory cells based on transitions of output signals from a plurality of comparators 205 with a simple construction. Further, by the reference value generation section 104 of such a circuit construction, the reference value can be generated simultaneously with the counting by the counter 206 during the discharge (or charge) of bit lines.

Further, pulse signals representing transitions of output signals derived from a plurality of comparators 205 are generated by the plurality of pulse signal generation circuits 420, respectively, and those plurality of pulse signals are ORed by the OR signal generation circuit 430, by which the OR signal FLAGj is obtained. As a result of this, signals representing a set of transition points (points each showing an end of a discharge period (or charge period)) of output signals derived from the plurality of comparators 205 can be detected with a simple construction.

Also, by delaying individual clock signals inputted to the plurality of counters 206 one after another by the clock signal delay circuit 207, count operations by the counters 206 are also artificially delayed in accordance with wiring delay and logic circuit delay, so that a count value corresponding to actual discharge period (or charge period) can accurately be counted.

Also, charging/discharging control signals for use of discharge or charge, which are inputted to a plurality of bit line charging/discharging circuits provided for every four of the bit lines are delayed one after another by the charging/discharging control signal delay circuits, by which wiring delay and logic circuit delay are artificially created so that the timing at which discharge of the bit lines is performed is also delayed. As a result of this, even with wiring delay or logic circuit delay, simultaneity of charge and discharge operations can be maintained among all the memory cells connected to one word line, so that an accurate reference value can be obtained. It is noted that the bit line charging/discharging circuits may be provided for every one bit line or for every any plurality other than four out of the bit lines.

In the reference value determination circuit 114, the upper-limit value showing a boundary of distributions of information stored in a plurality of memory cells and the reference value of the reference value generation section 104 are compared with each other to more extent, by which a decision as to the state of distribution of stored information is made by using the upper-limit value showing a boundary of distributions of information stored in a plurality of memory cells. Therefore, even if stored information of memory cells to be read out at a time is "0" in all or "1" in all, it is possible to make a decision of that so that data can be read accurately.

Also, a write end decision value in write operation is used as the upper-limit value, an optimum upper-limit value that is not affected by secular changes can be obtained without providing any additional circuits.

Also, whether or not a write operation has been ended is decided by the write/erase end decision circuit 210, and based on a result of the decision, the voltage applied to bit lines is controlled by the write/erase voltage control circuit 211. As a result of this, count values among stored information pieces of individual memory cells after an end of a write operation can be uniformized so that the distribution width of cell current values can be narrowed.

Also, whether or not an erase operation has been ended is decided by the write/erase end decision circuit 210, and based on a result of the decision, the voltage applied to bit lines is controlled by the write/erase voltage control circuit 211. As a result of this, count values among individual memory cells after an end of an erase operation can be uniformized so that the distribution width of cell current values can be narrowed.

Also, by making it possible to output potentials of bit lines selected by the column decoder 208 to outside, it becomes possible to directly measure cell currents of individual memory cells with a peripheral circuit or a measuring instrument outside the chip. Thus, it becomes possible to do debug or correction of circuits as well as measurement of detailed memory cell characteristics and the like.

With this semiconductor storage device, even in use of a side wall memory in which cell current values are more highly influenced by stored information of neighboring charge retention regions (e.g., nitride) selected by an identical word line, stored information of desired charge retention regions can accurately be read out.

In the case where the semiconductor storage device of the invention is used for electronic equipment such as portable information equipment (portable telephones etc.), digital cameras, digital recorders and the like, since neither reference cell nor a circuit for adjusting the cell current value of the reference cell is used, increases in chip area and power consumption can be suppressed. Also, memory cell information can accurately be read out even if the distributions of cell currents are varied among word lines or changed with time. Thus, there can be provided electronic equipment having high reliability.

In the foregoing embodiment, in a read operation in which discharge of bit lines is performed by the bit line charging/discharging part 201, a count value representing a discharge period over which the potential of a bit line comes to a specified potential is counted by the counter 206 based on a comparison result of the comparator 205. Instead, the invention may be applied to a semiconductor storage device in which in a write operation in which charge of bit lines is performed by the bit line charging/discharging part, a count value representing a charge period over which the potential of a bit line comes to a specified potential is counted by the counter based on a comparison result of the comparator.

The foregoing embodiment has been described on a semiconductor storage device including the write/erase end decision circuit 210 and the write/erase voltage control circuit 211. However, the semiconductor storage device may be one including either a write end decision circuit and a write voltage control circuit or an erase end decision circuit and an erase voltage control circuit.

(Modification with Use of A/D Converter)

Figure 15:
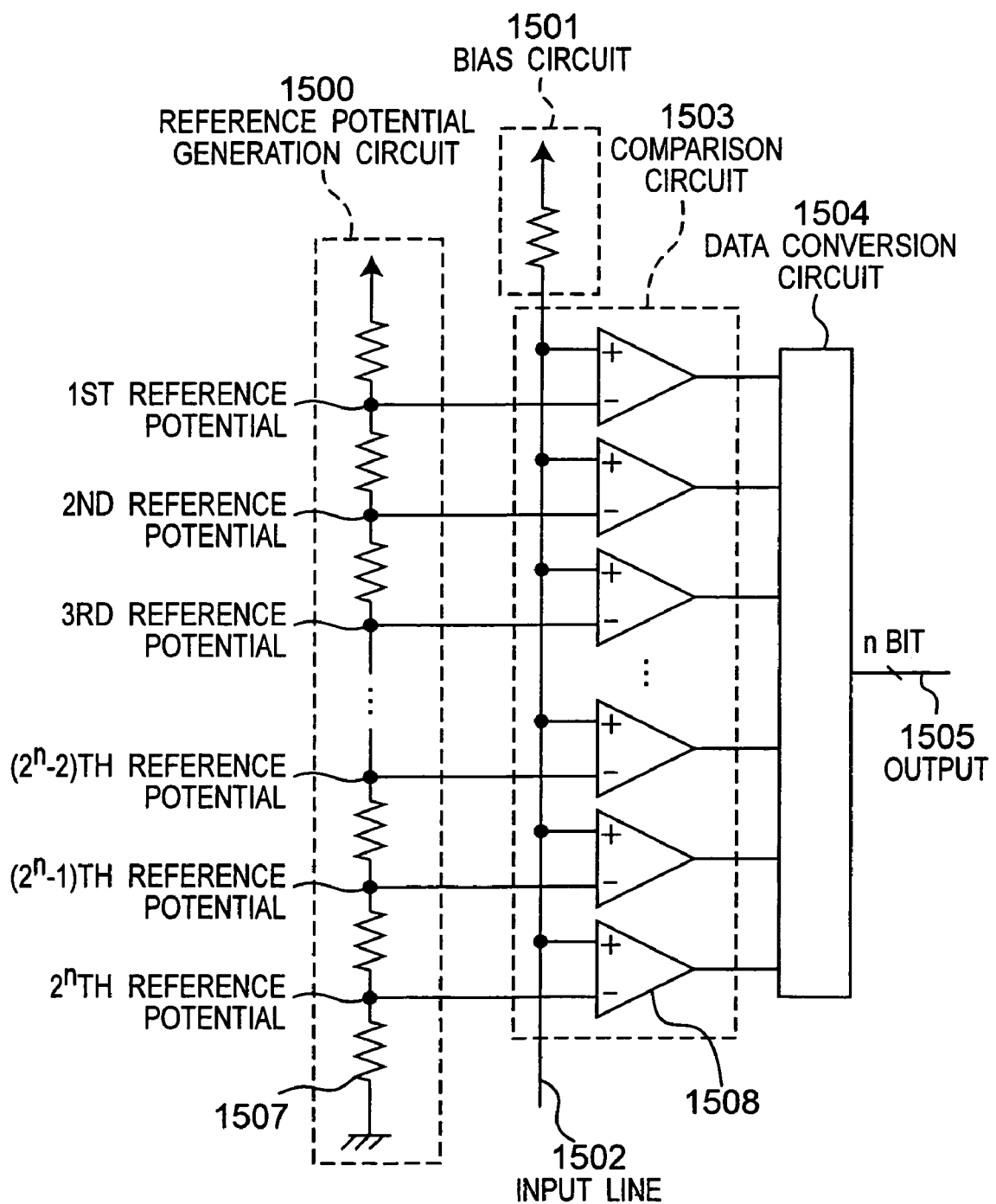
FIG. 15 is a view showing an A/D converter serving as a cell current-related value read circuit.

Whereas the comparators 205 and the counters 206 are provided as the cell current-related value read circuit of the invention In the foregoing embodiment, the cell current-related value read circuit may be an A/D converter. That is, in the semiconductor storage device of FIG. 2, such an A/D converter as shown in FIG. 15 instead of the comparators 205 and the counters 206 is connected to an output line of the bit line select circuit 204. This A/D converter is a flash type A/D converter which converts a potential of a bit line SBL selected by the bit line select circuit 204 into a digital signal at a specified timing and outputs the signal to a bus line CBUS. The values of bit line potentials outputted by the A/D converter are used as values related to the currents flowing through memory cells of the invention, by which information stored in the memory cells are decided.

As already described, among bit lines that have been charged to a specified potential, those connected to memory cells of larger cell currents take shorter time to reach a reference potential from a start of discharge, than those connected to memory cells of smaller cell currents. In this connection, bit lines of larger cell currents are lower in their potential on the way of discharge than bit lines of smaller cell currents. Accordingly, a cell current and a bit line potential on the way of discharge have a relationship of generally inverse proportion to each other. That is, they have a relationship similar to that between a cell current and a count value detected by the counter 206. For this reason, a decision as to stored information of a memory cell can be made by using the bit line potential detected by the A/D converter instead of the count value detected by the counter 206.

The A/D converter, as shown in FIG. 15, has a reference potential generation circuit 1500, a comparison circuit 1503, a bias circuit 1501, and a data conversion circuit 1504. In the reference potential generation circuit 1500, $2^n+1$ resistors 1507 are connected in series so that first to $2^n$-th reference potentials are generated between the resistors 1507. The comparison circuit 1503 has $2^n$ comparators 1508, and first to $2^n$-th reference potentials of the reference potential generation circuit 1500 are connected to – (negative) input terminals of the individual comparators 1508. The + (positive) input terminals of the $2^n$ comparators 1508 are connected to an output line of the bit line select circuit 204 via an input line 1502. The input line 1502 is connected to a bias circuit 1501. Based on outputs from the $2^n$ comparators 1508, the data conversion circuit 1504 outputs an n-bit signal showing bit line potential data from an output line 1505 to the bus line CBUS.

The semiconductor storage device including the A/D converter shown above performs a decision as to memory cell information as follows. That is, as in the foregoing embodiment, all the bit lines BL0, BL1, . . . are charged by the bit line charging/discharging circuits 201, and only bit lines BL0, BL4, . . . selected by the bit line select circuits 204 are connected to the A/D converter. Then, discharge of the selected bit lines BL0, BL4, . . . is started. After elapse of a specified time period from the start of discharge, signals showing potentials of the corresponding bit lines BL0, BL4, . . . are outputted from the data conversion circuit 1504 of the A/D converter to the bus line CBUS. From distributions of potentials of the bit lines BL0, BL4, . . . , a reference value for deciding information of memory cells connected the bit lines BL0, BL4, . . . is determined by a logic circuit connected to the bus line CBUS. More specifically, as in the distributions of count values of FIGS. 11A to 11C, the potentials of the bit lines BL0, BL4, . . . are plotted along the horizontal axis and the numbers of memory cells MC00, MC04, . . . connected to the bit lines BL0, BL4, . . . are plotted along the vertical axis, by which the distribution of numbers of memory cells MC00, MC04, . . . versus the potentials of the bit lines BL0, BL4, . . . is grasped. In this distribution, there arise crests counting the same number equal to the number (2 in binary value, 4 in quaternary value) of values of the information in response to stored information of the memory cells MC00, MC04, . . . .

As shown above, bit line potentials detected by the A/D converter have the same relationship with cell currents of the memory cells MC00, MC04, as the count values described above. Accordingly, by using the A/D converter, it becomes implementable to decide information of the memory cells MC00, MC04, . . . , as in the case where count values are detected. It is noted that the A/D converter may be of a pipeline type, of successive comparison type or of other type than the flash type.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor storage device, comprising:
    a memory cell array in which a plurality of nonvolatile memory cells are arrayed;
    word lines connected to control input terminals of the plurality of memory cells;
    bit lines connected to input/output terminals of the plurality of memory cells;
    a word line select circuit for selecting the word lines;
    a bit line charging/discharging section for performing charge and discharge of the bit lines;
    a cell current-related value read circuit for, with respect to all or a specified number of memory cells out of the plurality of memory cells, performing discharge or charge of the bit lines by the bit line charging/discharging section to read cell current-related values related to cell currents flowing through the individual memory cells;
    a reference value generation section for, based on a distribution of the cell current-related values read by the cell-current related value read circuit, generating a reference value to determine information stored in the memory cells;
    a data decision circuit for comparing the values related to cell currents read by the cell-current related value read circuit and the reference value derived from the reference value generation section with each other; and
    an output section for, based on a result of the comparison by the data decision circuit, outputting information stored in each of the plurality of memory cells.

2. The semiconductor storage device as claimed in claim 1, wherein
    the cell-current related value read circuit has
    an A/D converter for converting potentials of the bit lines as the cell current-related values from analog to digital form in a read operation in which discharge or charge of the bit lines is performed by the bit line charging/discharging section.

3. The semiconductor storage device as claimed in claim 1, wherein
the cell current-related value read circuit has
a comparator to which the bit lines are connected and which compares potentials of the bit lines and the reference potential with each other, and
a counter for, based on a result of the comparison by the comparator, counting count values representing discharge periods or charge periods over which the potentials of the bit lines come to a specified potential, as cell current-related values, in a read operation in which discharge or charge of the bit lines is performed by the bit line charging/discharging section.

4. The semiconductor storage device as claimed in claim 3, wherein
the comparator is provided in a plurality, and
the reference value generation section has
a data transition detection circuit to which outputs of the plurality of comparators are connected,
a reference value detection circuit to which an output of the data transition detection circuit is connected, and
a reference value counter to which an output of the reference value detection circuit is connected.

5. The semiconductor storage device as claimed in claim 4, wherein
the comparator is provided in a plurality, and
the data transition detection circuit has
a plurality of pulse signal generation circuits responsive to transitions of outputs of the plurality of comparators, and
an OR signal generation circuit for generating an OR signal of outputs of the plurality of pulse signal generation circuits.

6. The semiconductor storage device as claimed in claim 3, wherein
the counter is provided in a plurality, and
a time difference is imparted to clock signals inputted to the plurality of counters, respectively.

7. The semiconductor storage device as claimed in claim 1, wherein
the bit line charging/discharging section has a plurality of bit-line charging/discharging circuits, and a time difference is imparted to discharge or charge timing signals inputted to the individual bit line charging/discharging circuits.

8. The semiconductor storage device as claimed in claim 1, further comprising:
an upper-limit value register for holding an upper-limit value; and
a reference value determination circuit for comparing the upper-limit value of the upper-limit value register with an output of the reference value generation section.

9. The semiconductor storage device as claimed in claim 8, wherein
a write end decision value for write operation is used as the upper-limit value.

10. The semiconductor storage device as claimed in claim 3, further comprising:
a write end decision circuit for comparing a write-use count value and a count value of the counter obtained from a read for verify in write operation with each other to decide whether or not a write operation has been ended; and
a write voltage control circuit for controlling voltages applied to the bit lines based on a decision result by the write end decision circuit.

11. The semiconductor storage device as claimed in claim 3, further comprising:
an erase end decision circuit for comparing an erase-use count value and a value of the counter obtained from a read for verify in erase operation with each other to decide whether or not an erase operation has been ended; and
an erase voltage control circuit for controlling voltages applied to the bit lines based on a decision result by the erase end decision circuit.

12. The semiconductor storage device as claimed in claim 1, further comprising
a bit line potential output circuit for selecting from among the bit lines and outputting potentials of the selected bit lines to outside.

13. The semiconductor storage device as claimed in claim 1, wherein
the nonvolatile memory cells are implemented by using a side wall memory having a source region, a drain region, a channel region formed between the source region and the drain region, a gate formed on the channel region, and charge retention regions formed on both sides of the gate.

14. Electronic equipment in which the semiconductor storage device as claimed in claim 1 is used.

* * * * *